United States Patent
Hammerschmidt et al.

(10) Patent No.: US 11,320,497 B2
(45) Date of Patent: May 3, 2022

(54) REDUDANT MAGNETIC FIELD SENSOR ARRANGEMENT FOR ERROR DETECTION AND METHOD FOR DETECTING ERRORS WHILE MEASURING AN EXTERNAL MAGNETIC FIELD USING REDUNDANT SENSING

(71) Applicant: Infineon Technologies AG, Neubiberg (DE)

(72) Inventors: Dirk Hammerschmidt, Finkenstein (AT); Helmut Koeck, Villach (AT); Andrea Monterastelli, Villach (AT); Tobias Werth, Villach (AT)

(73) Assignee: Infineon Technologies AG

( * ) Notice: Subject to any disclaimer, the term of this patent is extended or adjusted under 35 U.S.C. 154(b) by 125 days.

(21) Appl. No.: 16/165,565

(22) Filed: Oct. 19, 2018

(65) Prior Publication Data

US 2019/0120914 A1 Apr. 25, 2019

(51) Int. Cl.
*G01R 33/02* (2006.01)
*G01R 33/00* (2006.01)

(52) U.S. Cl.
CPC .......... *G01R 33/02* (2013.01); *G01R 33/0023* (2013.01)

(58) Field of Classification Search
CPC .................. G01R 33/02; G01R 33/0023
See application file for complete search history.

(56) References Cited

U.S. PATENT DOCUMENTS 6,087,722 A * 7/2000 Lee ............... H01L 23/4951
257/723
6,291,989 B1 * 9/2001 Schroeder ............. G01D 5/147
324/174

(Continued)

FOREIGN PATENT DOCUMENTS

CN 101676735 A 3/2010
CN 102298124 A 12/2011

(Continued)

OTHER PUBLICATIONS

Angle Sensor-Dual GMR/AMR Angle Sensor—TLE5309D; V1.0 [online] Published by Infineon Technologies AG on Jan. 2016, Retrieved from the internet: <https://static6.arrow.com/aropdfconversion/eea0b8fa9f30bb3a20ec190e3ecd2de10ee2ed39/88infineon-tle5309d_ds-ds-v01_00-en.pdffileid5546d4625607bd13015655.pdf>.

(Continued)

Primary Examiner — Jay Patidar
(74) Attorney, Agent, or Firm — Design IP

(57) ABSTRACT

A system includes a magnetic field sensor arrangement and a controller. The magnetic field sensor arrangement includes a first sensor chip having an integrated circuit differential magnetic field sensor circuit configured to generate a first output signal comprising first signal pulses, a second sensor chip having an integrated second differential magnetic field sensor circuit configured to generate a second output signal comprising second signal pulses, and at least one output signal terminal configured to output the first and the second output signals. The controller receives the first and the (Continued)

second signal pulses from the at least one output signal terminal, evaluates the first and the second signal pulses, and detects an error of an operation of the magnetic field sensor arrangement in response to the first and the second signal pulses not satisfying an expected output pattern of the first and the second signal pulses.

9 Claims, 18 Drawing Sheets

(56) References Cited

U.S. PATENT DOCUMENTS

| | | | | |
|---|---|---|---|---|
| 7,535,215 | B2 | 5/2009 | Forster | |
| 9,123,876 | B2 | 9/2015 | Deak et al. | |
| 9,995,600 | B2 | 6/2018 | Nagarkar et al. | |
| 10,328,972 | B2 | 6/2019 | Fujita et al. | |
| 10,380,879 | B2 * | 8/2019 | Haas | G01R 33/07 |
| 2004/0021457 | A1 * | 2/2004 | Johnson | G01P 13/045 |
| | | | | 324/161 |
| 2005/0258820 | A1 * | 11/2005 | Forster | G01D 5/145 |
| | | | | 324/165 |
| 2008/0116886 | A1 * | 5/2008 | Yamada | G01D 5/145 |
| | | | | 324/207.21 |
| 2008/0122436 | A1 * | 5/2008 | Pinkos | F16H 48/30 |
| | | | | 324/207.21 |
| 2011/0043197 | A1 * | 2/2011 | Trontelj | G01D 5/145 |
| | | | | 324/207.25 |
| 2012/0018827 | A1 | 1/2012 | Kestelli et al. | |
| 2012/0081109 | A1 * | 4/2012 | Astegher | G01R 33/07 |
| | | | | 324/251 |
| 2013/0335069 | A1 * | 12/2013 | Vig | G01R 33/072 |
| | | | | 324/207.12 |
| 2014/0097835 | A1 | 4/2014 | Sartee et al. | |
| 2015/0108971 | A1 * | 4/2015 | Granig | G01R 33/091 |
| | | | | 324/252 |
| 2016/0025529 | A1 | 1/2016 | Astegher et al. | |
| 2016/0178397 | A1 * | 6/2016 | Jost | G01R 33/0052 |
| | | | | 324/207.12 |
| 2017/0291640 | A1 * | 10/2017 | Fujita | B62D 5/049 |
| 2018/0087889 | A1 * | 3/2018 | Ausserlechner | G01D 5/165 |
| 2019/0316935 | A1 | 10/2019 | Jost et al. | |
| 2019/0383885 | A1 * | 12/2019 | Sitorus | G01R 33/091 |

FOREIGN PATENT DOCUMENTS

| | | |
|---|---|---|
| CN | 103081110 A | 5/2013 |
| CN | 104101366 A | 10/2014 |
| CN | 104900599 A | 9/2015 |
| CN | 105301530 A | 2/2016 |
| CN | 105716632 A | 6/2016 |
| CN | 106482755 A | 3/2017 |
| DE | 102004017191 A1 | 7/2007 |
| DE | 202014103355 U1 | 9/2014 |
| DE | 102017205863 A1 | 10/2017 |
| EP | 2290380 B1 | 3/2012 |
| EP | 3147631 A2 | 3/2017 |

OTHER PUBLICATIONS

TLE4998S8(D)—High Performance Programmable Single/Dual Linear Hall Sensor; Data Sheet, Revision 1.1 [online] Published by Infineon Technologies AG on Jul. 2017, Retrieved from the internet: <https://media.digikey.com/pdf/Data%20Sheets/Infineon%20PDFs/TLE4998S8_D_Rev1.1_2017-07.pdf>.

Micronas, GmbH; Data Sheet HAR 3715, HAR 372x, HAR 373x: Robust Dual-Die Programmable 2D Position Sensor Family with Arbitrary Output Function; May 5, 2017; Retrieved from the internet: <https://www.micronas.com/en/system/files/downloads/files/HAL371x_HAL372x_HAL%20373x_Programmable_2D_Position_Sensors_with_Arbitrary_Output_Function_1DSH_final.pdf>.

Scheibenzuber, Wolfgang; Dual-sensor package technology—Supporting ASIL-D in Safety-Related Automotive Applications; [online] Publication Date: 2015; Nuremberg; Retrieved from the internet: <https://www.infineon.com/dgdl/SENSOR%202015%20Dual-Sensor-Package_Speech_Scheibenzuber_neu_Wanda.pdf?fileld=5546d4614d7658ff014d90227d720026>.

* cited by examiner

FIG. 1
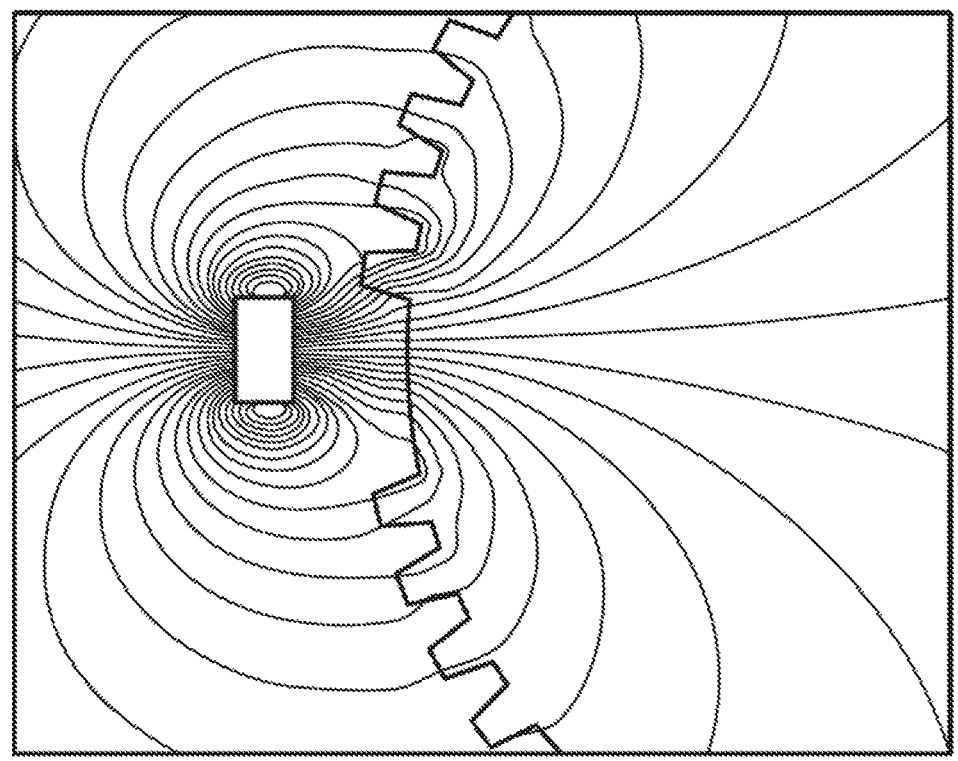
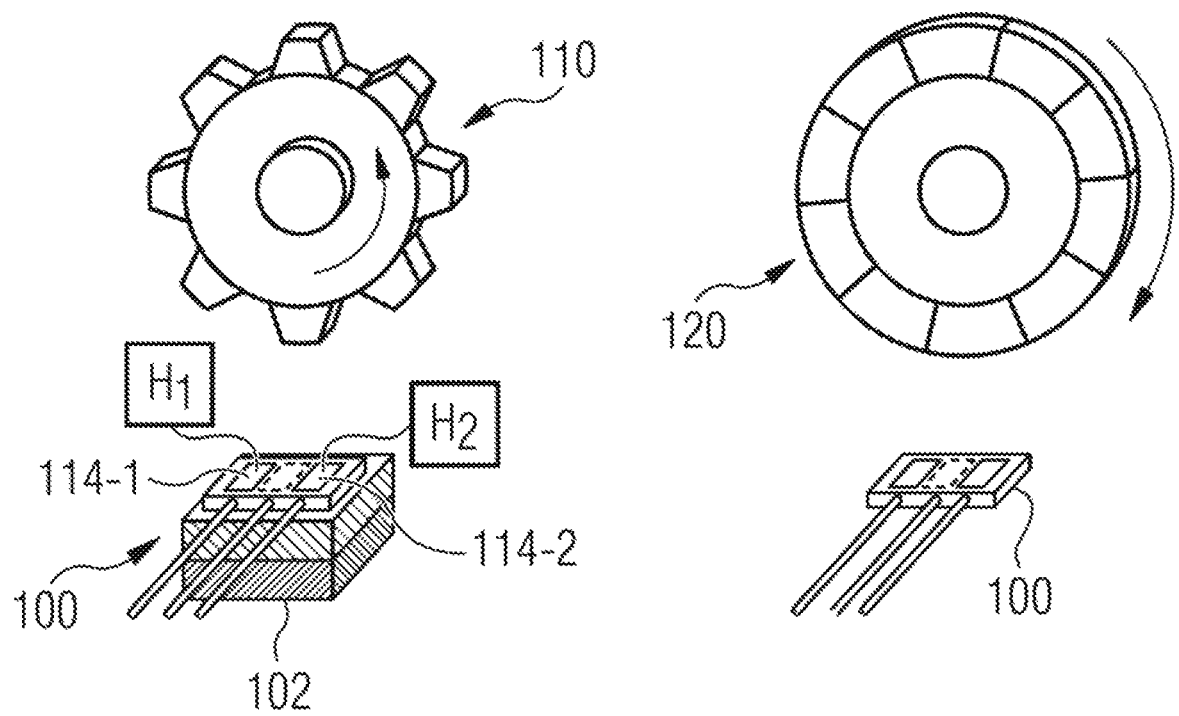

FIG. 4
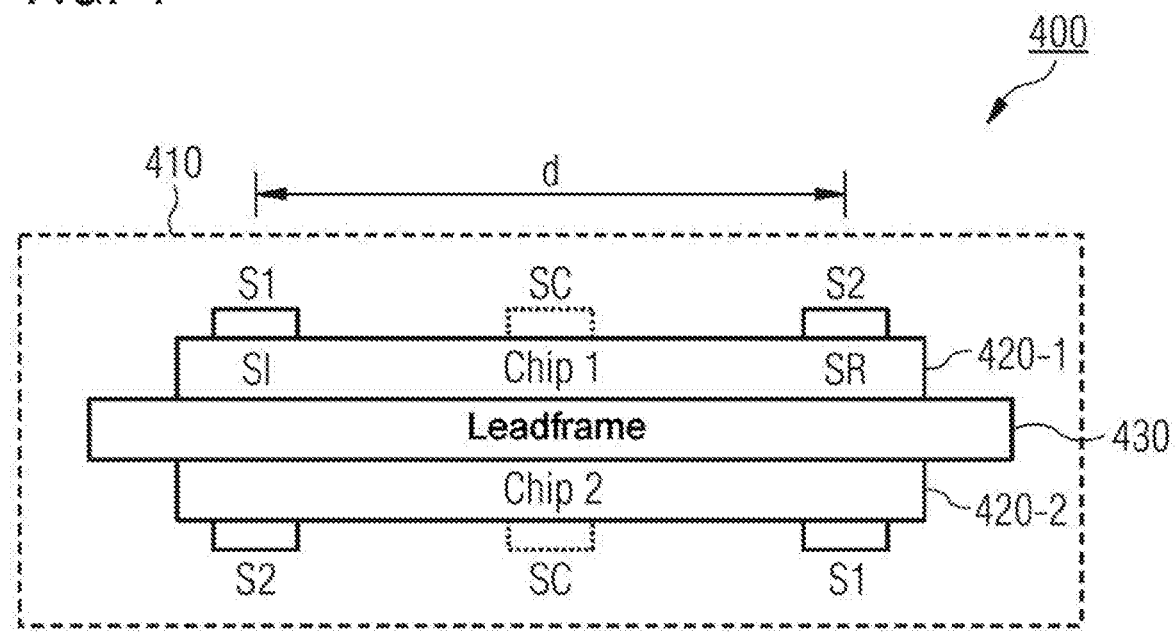
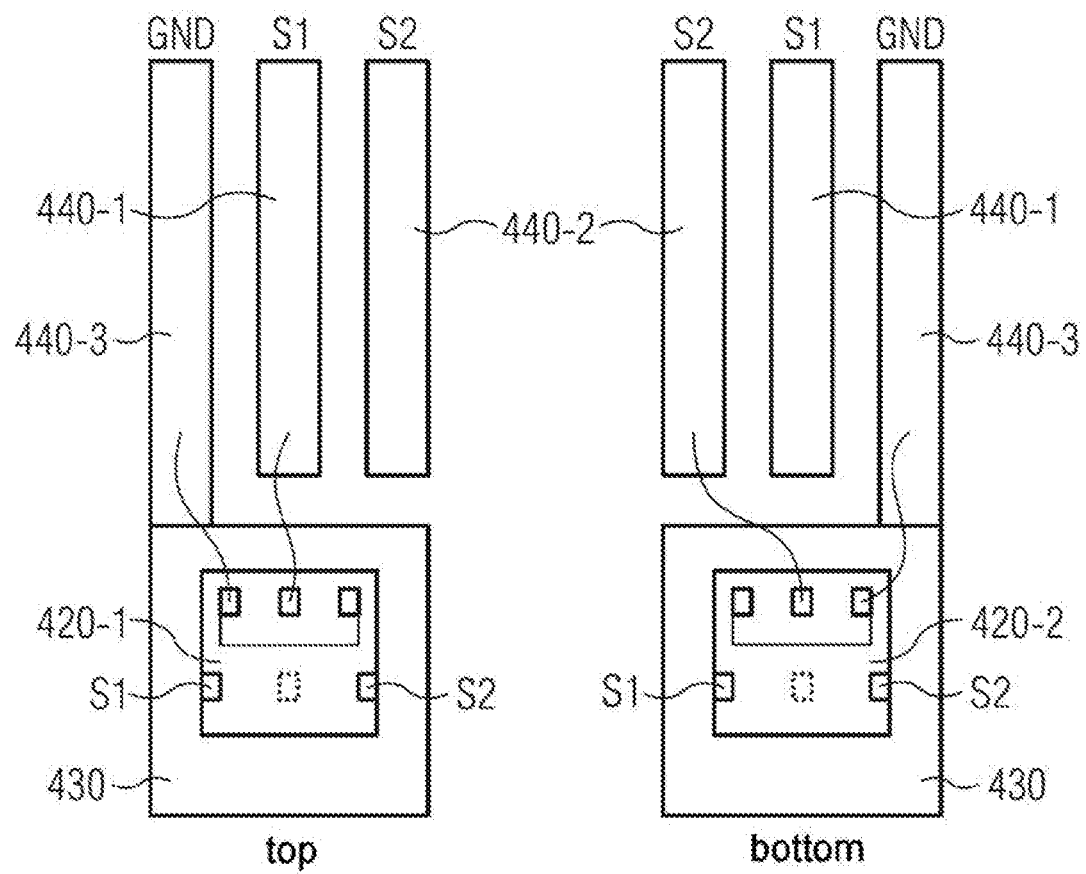

S1 identical to S2 -> inverse signal
on account of a flipped chip S2
programmed to inverse polarity -> S1 = S2

FIG. 6
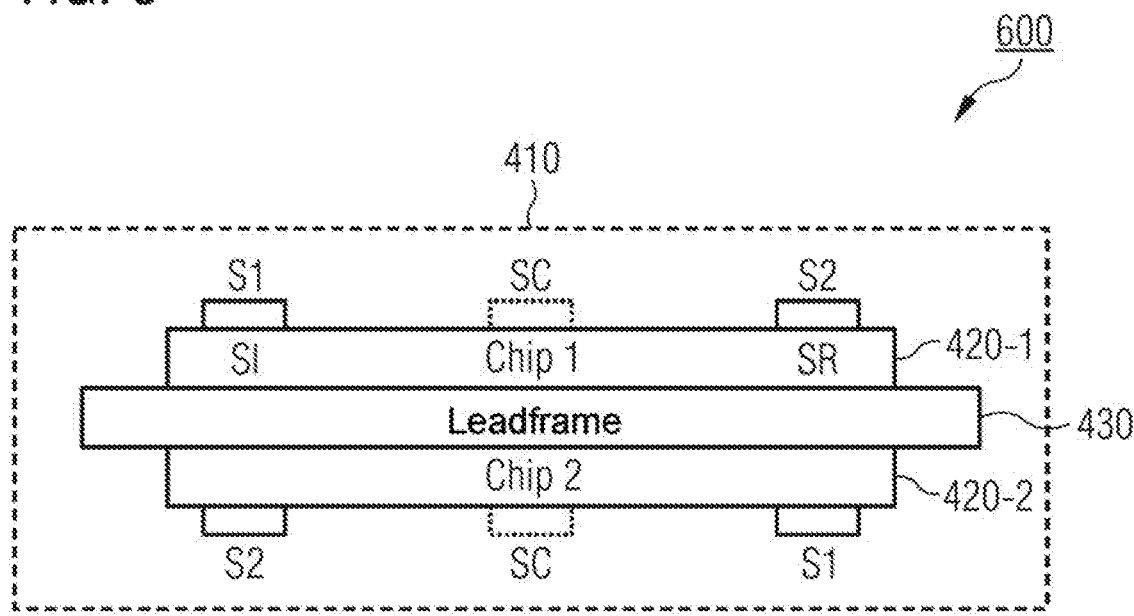
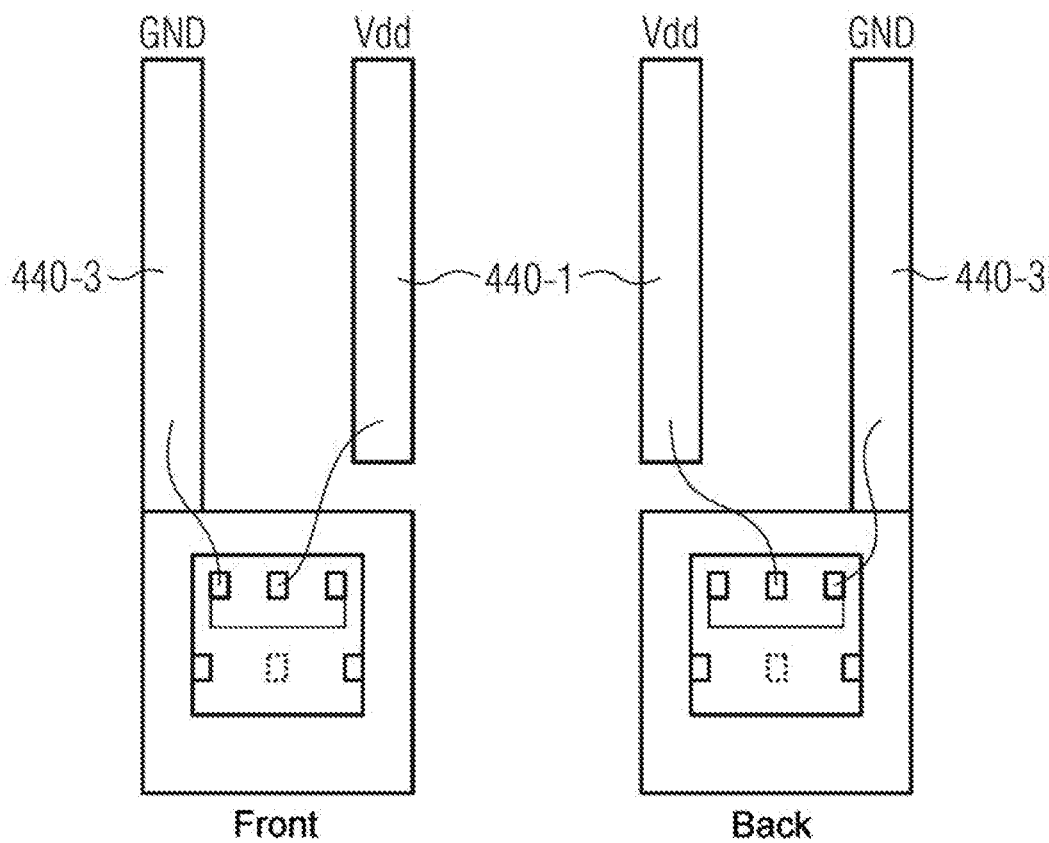

FIG. 7a
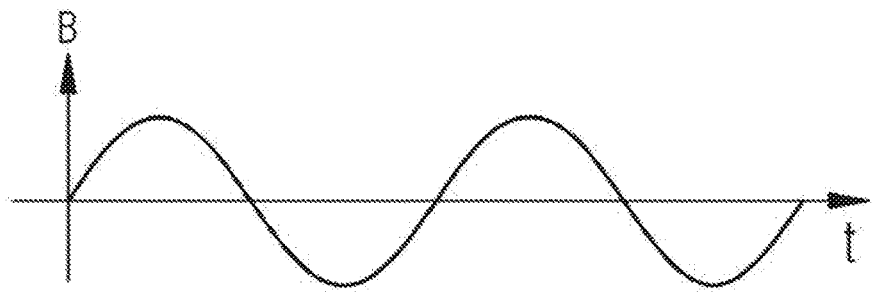
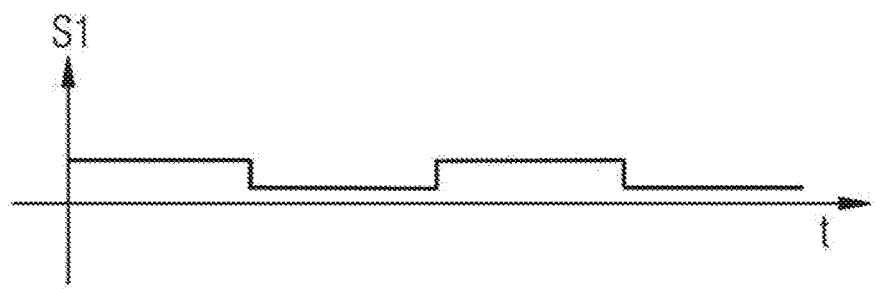
S2 programmed to inverse polarity -> S1 = S2
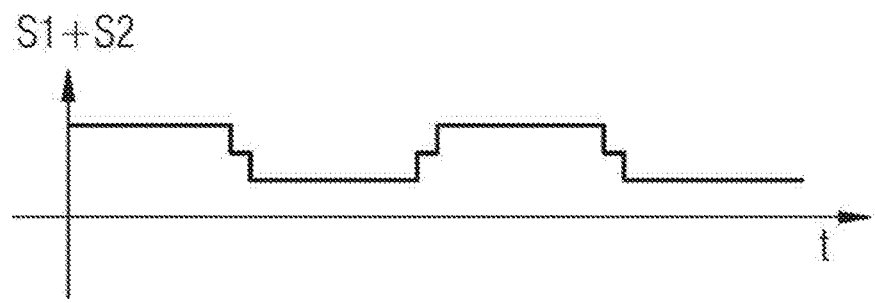

FIG. 7b
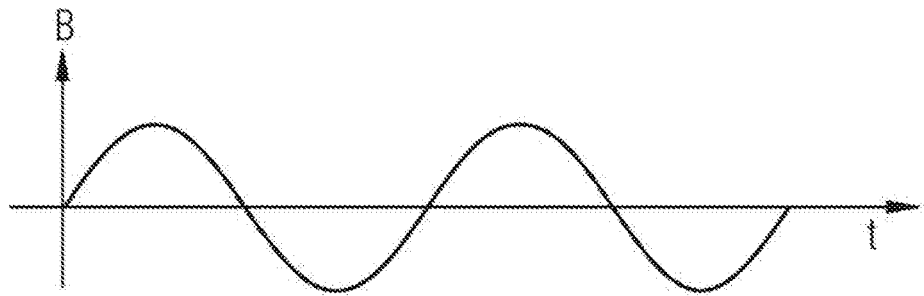
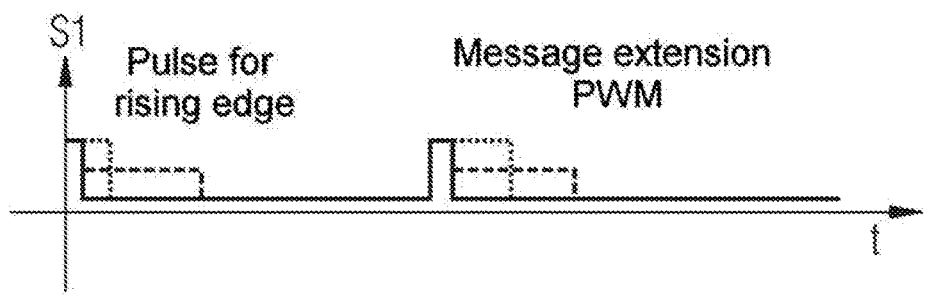
S1 identical to S2 -> inverse edge detected on account of the flipped chip
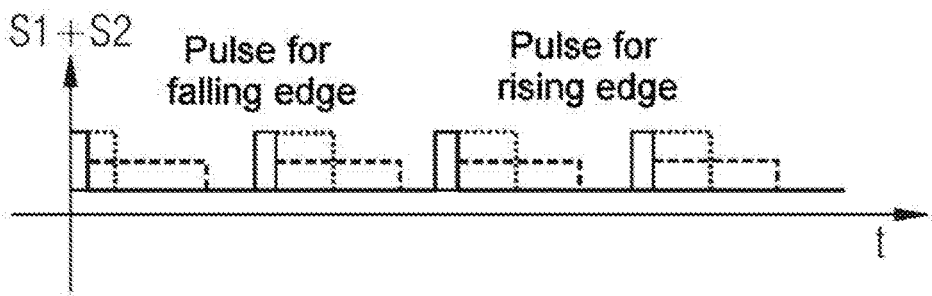

FIG. 8
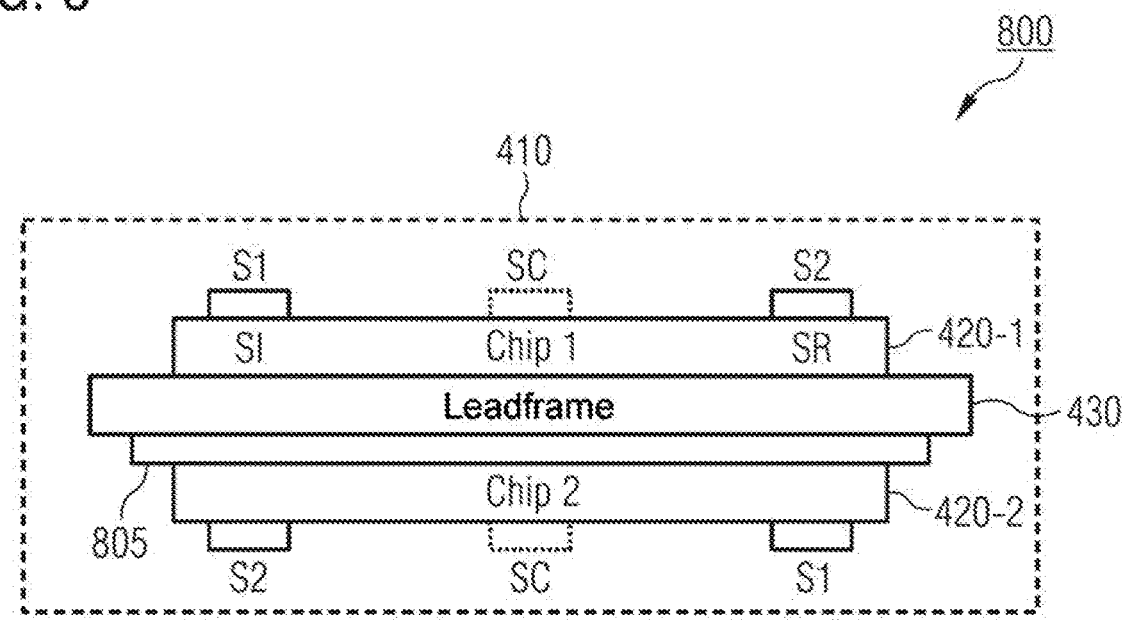
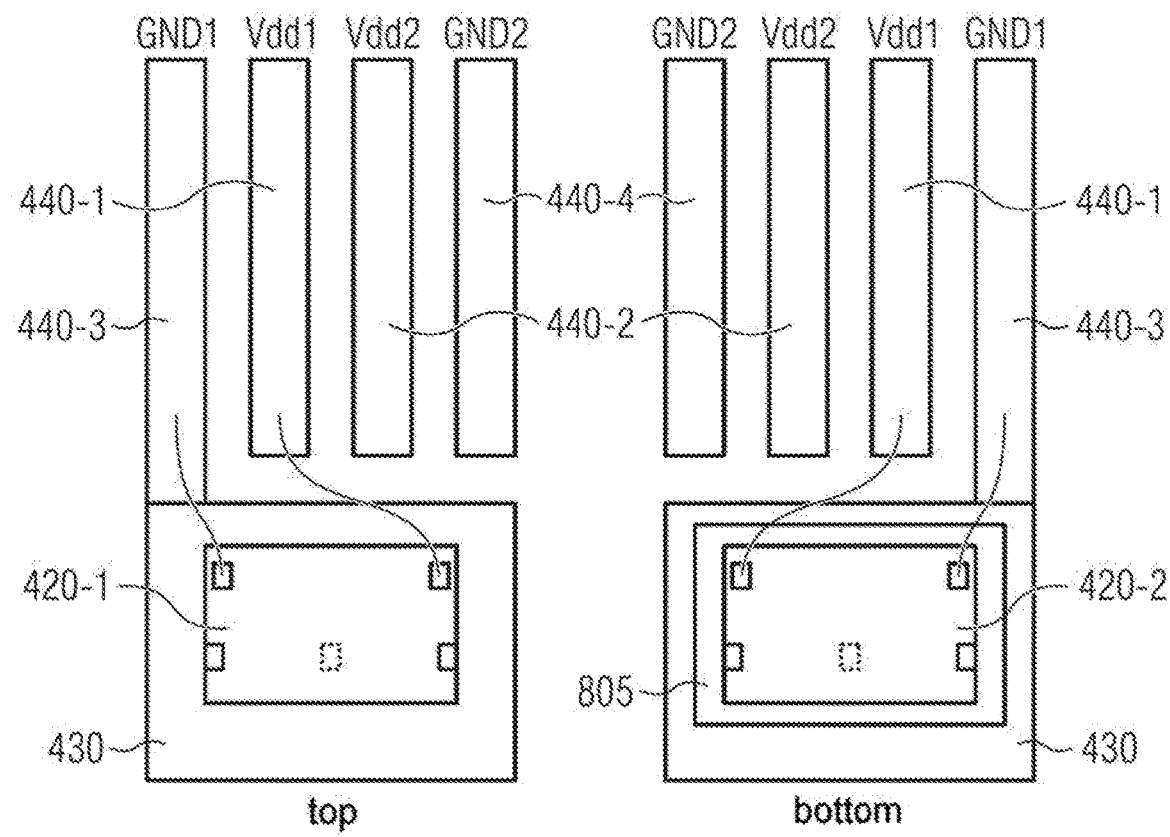

FIG. 10
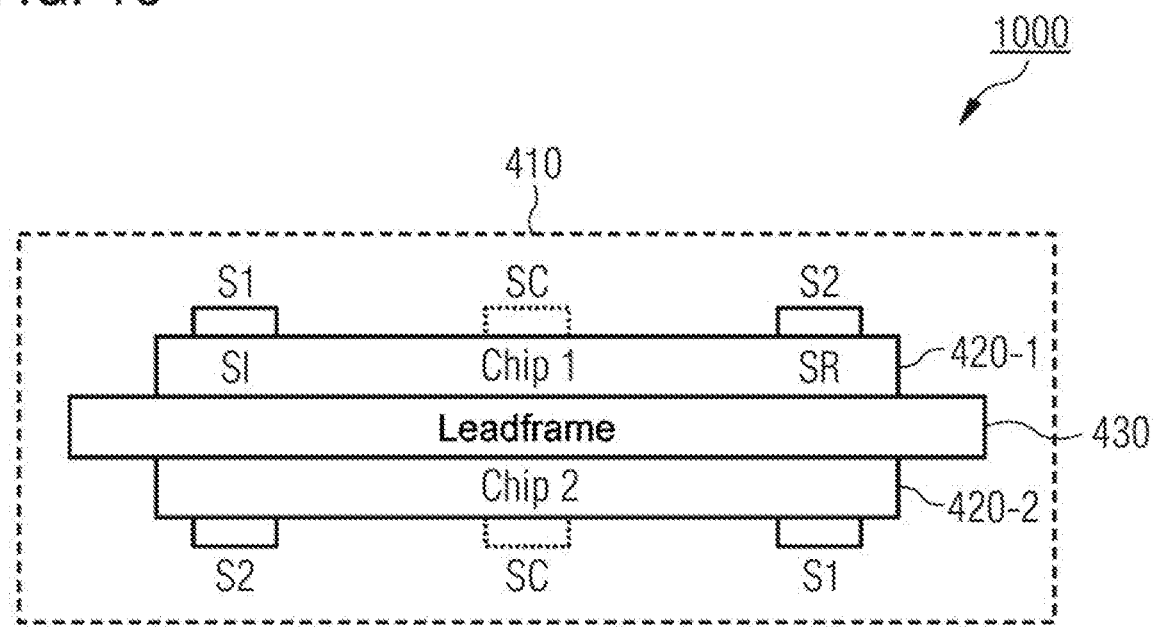
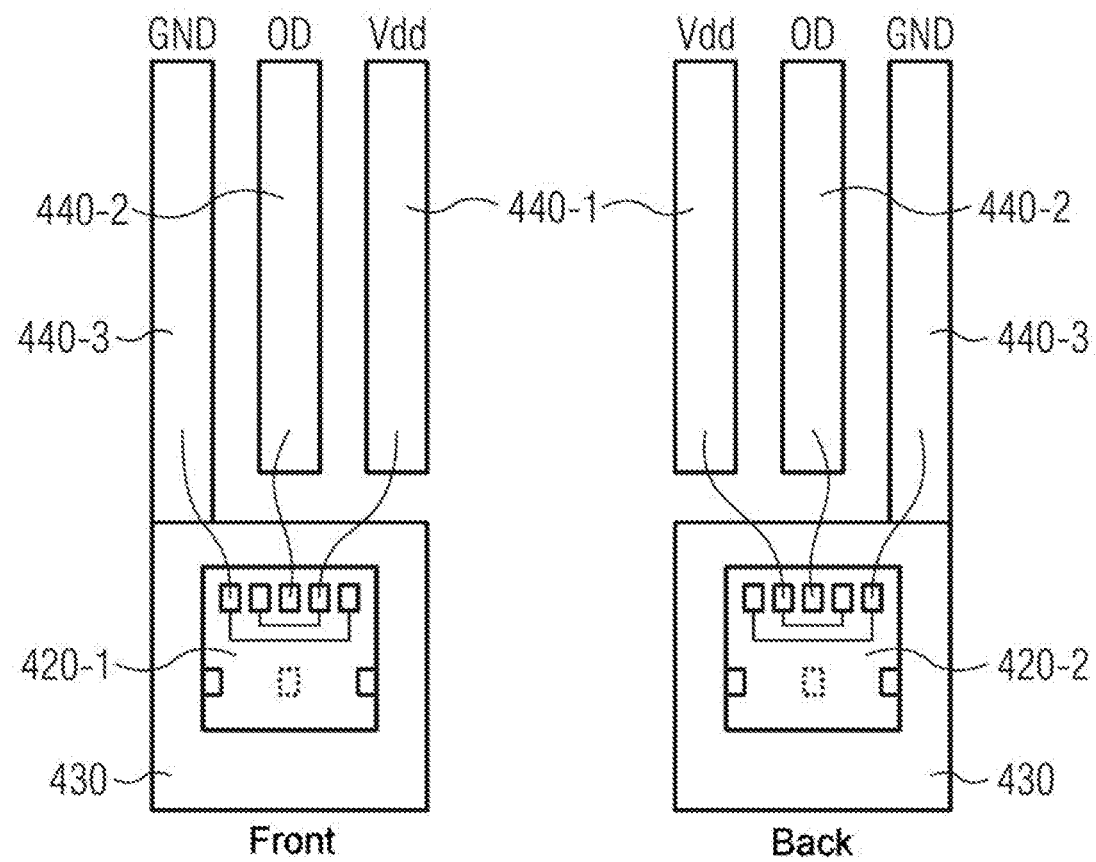

FIG. 11
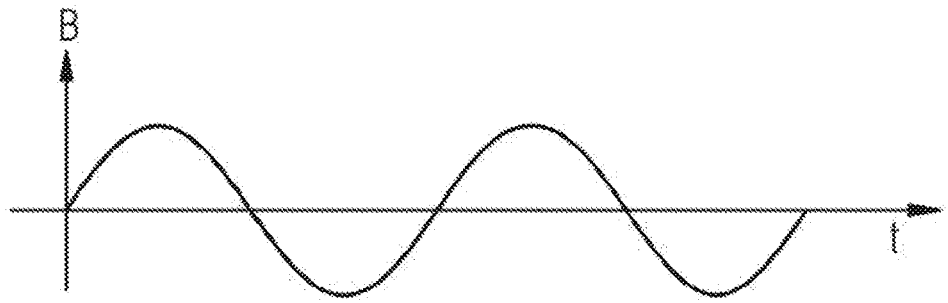
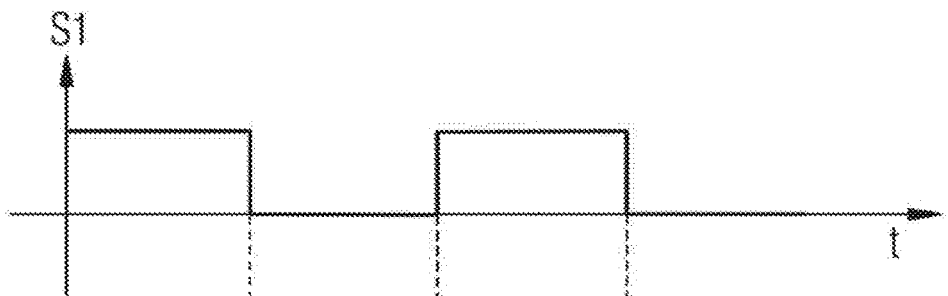
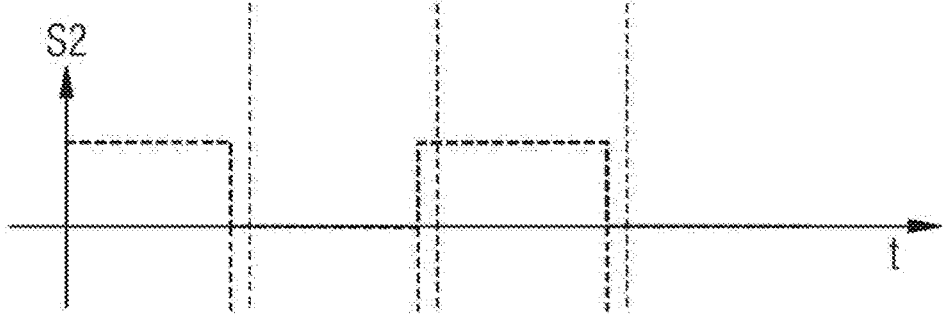
S2 programmed to inverse polarity -> S1 = S2
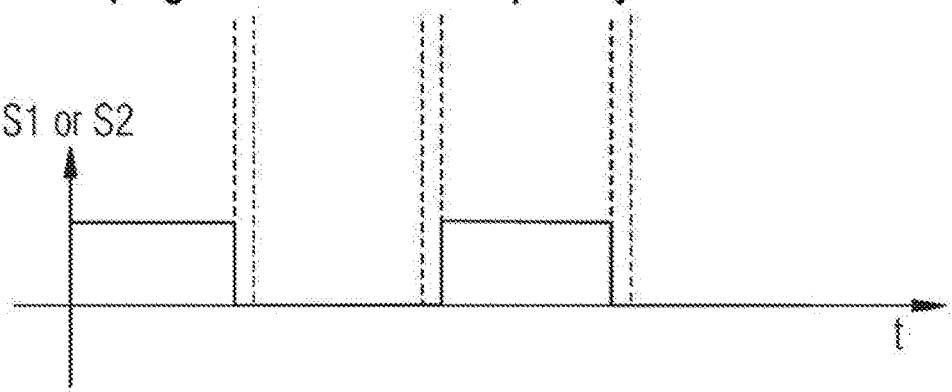

FIG. 12
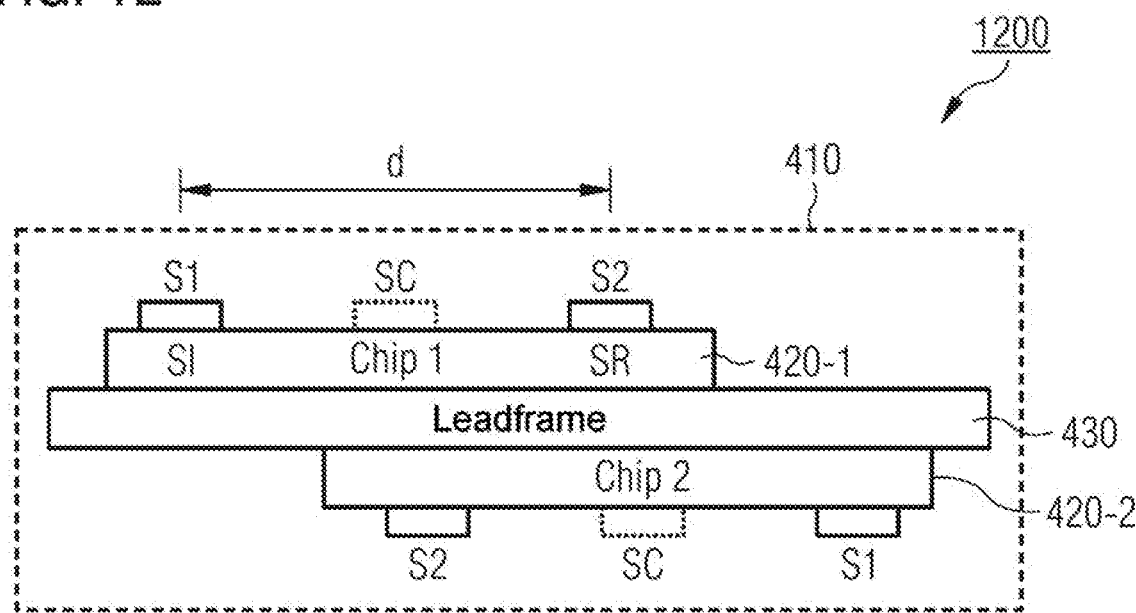
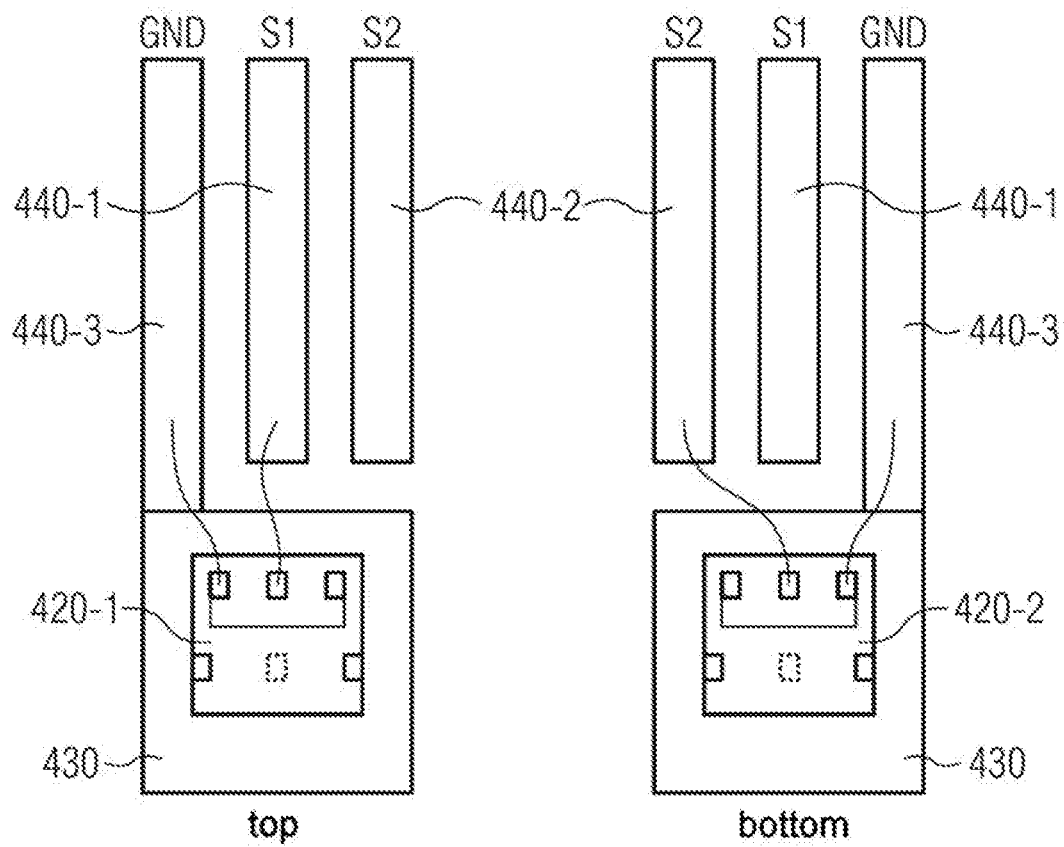

S1 identical to S2 -> inverse signal
on account of a flipped chip
S2 programmed to inverse polarity -> S1 = S2

FIG. 13b
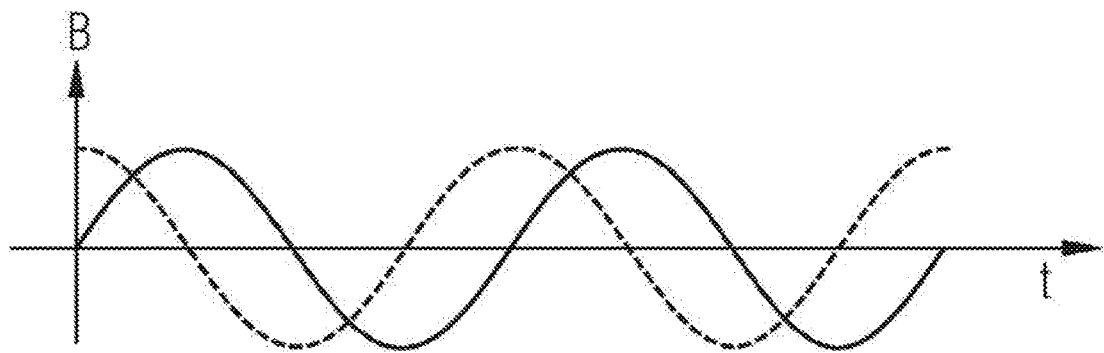
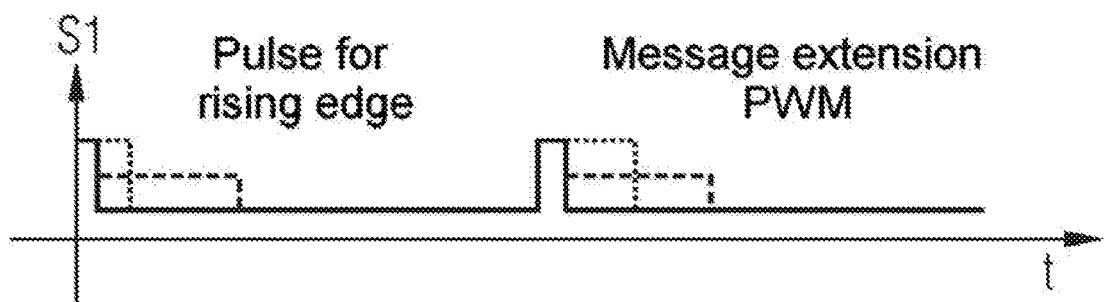
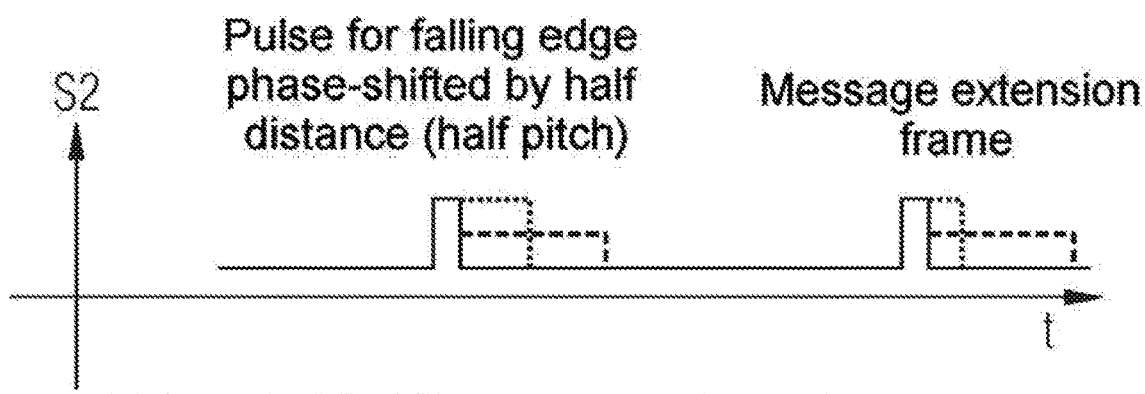
S1 identical to S2 -> inverse edge detected
on account of the flipped chip // REDUDANT MAGNETIC FIELD SENSOR ARRANGEMENT FOR ERROR DETECTION AND METHOD FOR DETECTING ERRORS WHILE MEASURING AN EXTERNAL MAGNETIC FIELD USING REDUNDANT SENSING

FIELD

The present disclosure is concerned generally with magnetic field sensors and in particular with redundancy concepts for magnetic field sensors in safety-critical applications.

BACKGROUND

Numerous vehicle, industrial and consumer applications rely on magnetic field sensors or magnetic sensors. The examples of such applications include speed sensing applications, e.g. wheel speed, transmission speed, crankshaft and camshaft sensing. Integrated circuits (ICs) with wheel speed sensor can be used to measure the speed of each wheel and to detect whether a wheel locks during braking (ABS). This measurement can be used as basic input signals for the electronic stability program (ESP) of an automobile. Magnetic angle sensors and linear Hall sensors can for example also be used to measure steering angle and steering moment. The use of Hall and magnetoresistive sensing elements for monolithically integrated magnetic sensors is known.

Precisely for safety-critical applications there is a need for magnetic sensors to be configured with maximum reliability.

SUMMARY

This need is taken into account by magnetic field sensor arrangements and methods for measuring external magnetic fields as claimed in the independent patent claims. The dependent claims relate to advantageous developments.

In accordance with a first aspect, the present disclosure proposes a magnetic field sensor arrangement. The latter has a sensor housing. A first sensor chip having an integrated first differential magnetic field sensor circuit is arranged in said sensor housing. Moreover, a separate second sensor chip having an integrated second differential magnetic field sensor circuit is arranged in the sensor housing.

In some exemplary embodiments, the first and second sensor chips (or sensor ICs) can be regarded in each case as unpackaged pieces of a semiconductor wafer, i.e., as separate dies, which are positioned together into the common sensor housing.

The first and second sensor chips each have at least two sensor elements in order to be able to form a differential signal. Exemplary embodiments having more than two sensor elements per sensor chip are also possible, for example if directions of rotation are also intended to be identified.

A redundancy concept is thus proposed in which at least two differential magnetic sensors are provided in a sensor housing, also referred to generally as chip housing or package. As viewed from outside, the proposed magnetic field sensor arrangements can appear like conventional sensor packages having only one differential magnetic sensor. At least some embodiments can therefore be incorporated and connected in a conventional manner, for example into a vehicle.

A concept having at least two redundant sensor chips in a common housing is involved, as already mentioned above.

Therefore, the first and second sensor chips can be configured to measure the same external magnetic field, which, in some applications, can be generated or influenced for example by means of a magnetic encoder (for example active or passive pick-up wheel).

In some exemplary embodiments, the first sensor chip and the second sensor chip can be arranged on a common leadframe within the sensor housing. There are various possible embodiments here.

By way of example, the first sensor chip can be arranged on a top side of the common leadframe and the second sensor chip can be arranged on an underside of the common leadframe. This variant requires, at least in a horizontal or lateral direction, substantially the same structural space as conventional sensor packages having only one differential magnetic sensor, with the result that a magnetic field sensor arrangement of this type, in terms of its housing dimensions, differs only insignificantly from conventional sensor packages. In the case of this opposite arrangement of the first and second sensor chips, in some applications it may be advantageous if the first sensor chip has an inverse differential polarity relative to the second sensor chip. As a result, output signals generated by the first and second sensor chips in response to an external magnetic field can appear substantially identical (given correct functioning of the magnetic field sensor arrangement).

In some embodiments, the first sensor chip and the second sensor chip can be arranged with a lateral offset (offset in the plane defined by the leadframe) with respect to one another within the sensor housing. As a result, besides redundancy, it is also possible to improve an angular resolution with respect to conventional sensor packages having only one differential magnetic sensor. The laterally offset sensor chips can be situated on different sides of the common leadframe or on the same side.

In alternative embodiments of the magnetic field sensor arrangement, the first and second sensor chips can thus also be arranged alongside one another on the same side of the common leadframe, which indeed increases the dimensions in a lateral direction, but can significantly improve the resolution by comparison with conventional sensor packages having only one differential magnetic sensor.

In some embodiments, the sensor housing has at least two terminals in order to provide at least one electrical supply signal terminal (for supply current or voltage) and at least one ground terminal for the first and/or the second sensor chip.

In accordance with some embodiments, the at least two sensor chips in the sensor housing can be supplied with a common supply signal (current or voltage) via a common supply signal terminal. In accordance with some embodiments, the magnetic field sensor arrangement is thus configured such that the first and second sensor chips share a common supply signal terminal. Alternatively, separate supply signal terminals for separate supply signals for the at least two sensor chips are also possible.

The same analogously applies to the at least one ground terminal. Thus, in accordance with some embodiments, the at least two sensor chips in the sensor housing can be connected to a common ground terminal. In accordance with some embodiments, the magnetic field sensor arrangement is configured such that the first and second sensor chips share at least one common ground terminal. Alternatively, separate ground terminals for the at least two sensor chips are also possible.

In accordance with some exemplary embodiments, the sensor housing includes at least four terminals in order to provide electrically separate supply signal terminals and ground terminals for the first and the second sensor chips. In this case, at least one of the sensor chips can be arranged in a manner electrically insulated from a common leadframe for a galvanic decoupling of the sensor chips.

In some embodiments of the magnetic field sensor arrangement, the sensor housing can have a common output for output signals of the first and second sensor chips. Same common output can then be coupled—as in the case of a conventional sensor package having only one differential magnetic sensor—for example to a control unit such as, for example, an ECU (Electronic Control Unit). The first and second differential magnetic field sensor circuits or the respective sensor chips can thus be configured to provide a respective output signal at the common output depending on a measured magnetic field.

In accordance with some exemplary embodiments, the first and second differential magnetic field sensor circuits or the respective sensor chips can be configured to provide their respective output signal in accordance with the same pulse protocol, which can provide digital or analog output pulses. By way of example, the differential magnetic field sensor circuits can each generate signal pulses upon rising and/or falling edges of the respectively measured magnetic field, such that these signal pulses of the two differential magnetic field sensor circuits are measurable at the common output. The signal pulses can be binary (high/low), or else have a plurality of (>2) possible amplitude states. Information can be contained in the not necessarily discredited temporal position of the edges.

In accordance with some exemplary embodiments, the first integrated differential magnetic field sensor circuit can be configured to generate a first output pulse upon a rising edge of the measured magnetic field. The second integrated differential magnetic field sensor circuit can be configured to generate a second output pulse upon a falling edge of the measured magnetic field. That is of course likewise conceivable the other way around. It is likewise possible for both integrated differential magnetic field sensor circuits to generate their output pulses upon identical edges (rising and/or falling) of the measured magnetic field.

In some exemplary embodiments, the first and second sensor chips are based on the same magnetic field sensor technology. Known magnetic field sensor technologies are for example Hall sensors or magnetoresistive sensors based on the AMR (anisotropic magnetoresistive effect), GMR (Giant Magneto-Resistance) or TMR effect (TMR=Tunnel Magneto-Resistance). Alternatively, the first sensor chip can also be based on a different magnetic field sensor technology than the second sensor chip. By way of example, one can be a Hall sensor, and the other a magnetoresistive sensor. Alternatively, one can be based on a first magnetoresistive technology (for example AMR), and the second can be based on another magnetoresistive technology (for example GMR).

In accordance with a further aspect of the present disclosure, a system is proposed, including a magnetic field sensor arrangement having a first sensor chip having an integrated first differential magnetic field sensor circuit, said first sensor chip being arranged in a common sensor housing, and a second sensor chip having an integrated second differential magnetic field sensor circuit, said second sensor chip being arranged in the common sensor housing. Furthermore, the sensor housing has at least one output signal terminal for output signals of the first and second sensor chips depending on an external magnetic field. The system additionally includes a control unit, such as an ECU of a motor vehicle, for example, coupled to the at least one output signal terminal of the magnetic field sensor arrangement. The at least one output signal terminal can be an output signal terminal common to both sensor chips, or separate output signal terminals.

In accordance with some exemplary embodiments, the magnetic field sensor arrangement is configured to output signal pulses of the first and second sensor chips, said signal pulses being dependent on the external magnetic field, via the at least one output signal terminal. By way of example, a change in an output voltage or an output current between "low" (7 mA) and "high" (14 mA) can take place at the common output signal terminal.

In accordance with yet another aspect, a method for measuring an external magnetic field is proposed. The method includes generating, in response to the external magnetic field, a first output signal portion by means of a first sensor chip having an integrated first differential magnetic field sensor circuit, said first sensor chip being arranged in a common sensor housing; generating, in response to the external magnetic field, a second output signal portion by means of a second sensor chip having an integrated second differential magnetic field sensor circuit, said second sensor chip being arranged in a common sensor housing; and outputting the first and second output signal portions via at least one output signal terminal of the sensor housing.

As already mentioned, in accordance with some exemplary embodiments, the external magnetic field can be generated by means of a magnetic encoder assigned to both sensor chips.

BRIEF DESCRIPTION OF THE DRAWINGS

Some examples of devices and/or methods are explained in greater detail merely by way of example below with reference to the accompanying figures, in which:

FIG. 1 shows examples of incremental magnetic field sensing;

FIG. 4 shows a first exemplary embodiment of a sensor package with two differential magnetic sensor chips;

FIG. 6 shows a second exemplary embodiment of a sensor package with two differential magnetic sensor chips;

FIGS. 7a and 7b show edge and pulse protocols of output signals of the sensor package from FIG. 5;

FIG. 8 shows a third exemplary embodiment of a sensor package with two differential magnetic sensor chips;

FIG. 10 shows a fourth exemplary embodiment of a sensor package with two differential magnetic sensor chips;

FIG. 11 shows an edge protocol of the sensor package in accordance with FIG. 10;

FIG. 12 shows a fifth exemplary embodiment of a sensor package with two laterally offset differential magnetic sensor chips;

FIGS. 13a and 13b show edge and pulse protocols of output signals of the sensor package from FIG. 12;

DETAILED DESCRIPTION

Figure 2:
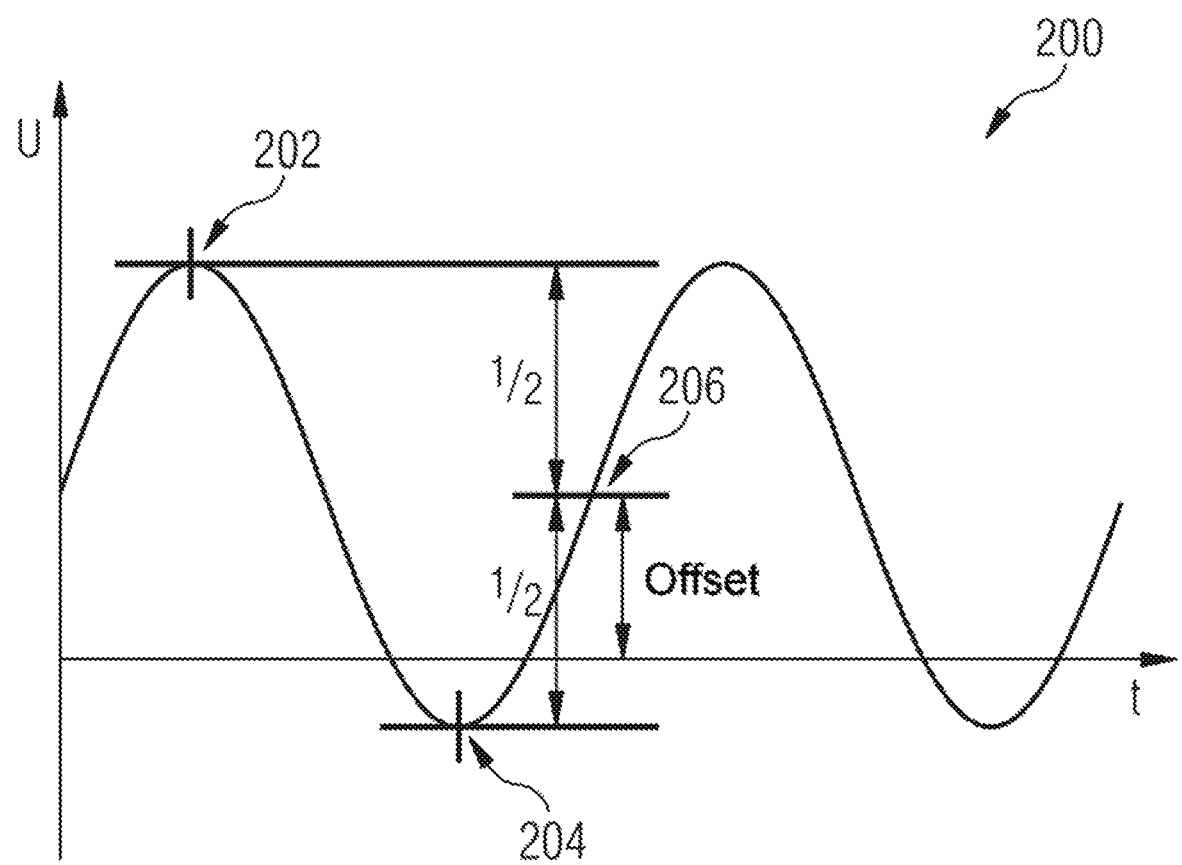
FIG. 2 shows a threshold value of a measured magnetic field, upon the crossing of which an output pulse is triggered.

Various examples will now be described more thoroughly with reference to the accompanying figures, which illustrate some examples. In the figures, the thicknesses of lines, layers and/or regions may be exaggerated for clarification purposes.

While further examples are suitable for various modifications and alternative forms, some specific examples thereof are correspondingly shown in the figures and are described thoroughly below. However, this detailed description does not restrict further examples to the specific forms described. Further examples can cover all modifications, counterparts and alternatives that fall within the scope of the disclosure. Throughout the description of the figures, identical reference signs refer to identical or similar elements which can be implemented identically or in modified form in a comparison with one another, while they provide the same or a similar function.

It goes without saying that if one element is designated as "connected" or "coupled" to another element, the elements can be connected or coupled directly or via one or more intermediate elements. If two elements A and B are combined using an "or", this should be understood such that all possible combinations are disclosed, i.e. only A, only B, and A and B. An alternative wording for the same combinations is "at least one from A and B". The same applies to combinations of more than two elements.

The terminology used here to describe specific examples is not intended to have a limiting effect for further examples. When a singular form, e.g. "a, an" and "the" is used, and the use of only a single element is defined neither explicitly nor implicitly as obligatory, further examples can also use plural elements in order to implement the same function. If a function is described below as implemented using a plurality of elements, further examples can implement the same function using a single element or a single processing entity. Furthermore, it goes without saying that the terms "comprises", "comprising", "has" and/or "having" in their usage make more precise the presence of the indicated features, integers, steps, operations, processes, elements, components and/or a group thereof, but do not exclude the presence or addition of one or more other features, integers, steps, operations, processes, elements, components and/or a group thereof.

Unless defined otherwise, all terms (including technical and scientific terms) are used here in their customary meaning in the field with which examples are associated.

Magnetic field sensors are widely used for example in incremental speed and position measurements. They detect changes in a magnetic field caused by a moving encoder (for example pick-up wheel). There are two types of magnetic encoders. The first version is an active encoder, which comprises differently polarized magnet poles. In this case, an incremental speed sensor is positioned in front of the encoder and detects whether the measured magnetic field changes its polarity. In this case, it generates an output signal indicating that a pole has moved past. The other alternative is a passive encoder (often a toothed wheel or a disk composed of ferromagnetic material having holes that move past in front of the magnetic field sensor), which deflects a magnetic field (for example back-bias magnetic field). The changes can be measured by detecting crossings through a switching point arranged between the minimum and the maximum of the magnetic field.

The abovementioned principles (active encoder, passive encoder) are compared in FIG. 1.

In the example in FIG. 1, on the left, a differential magnetic sensor 100 is used to detect a position and/or speed of a rotatably movable ferromagnetic toothed wheel or gearwheel (passive pick-up wheel) 110. The magnetic sensor 100 comprises a back-bias magnet 102 for generating a bias magnetic field, which is influenced by the moving pick-up wheel (for example gearwheel) 110. Furthermore, the magnetic sensor 100 comprises a first and second magnetic sensor element 114-1, 114-2 in order to sense (capture) variations of the bias magnetic field on account of the pick-up wheel 110. Examples of magnetic sensor elements are Hall sensor or magnetoresistive sensor elements. An optional signal processing circuit (not illustrated) can process further the signals provided by the magnetic sensor elements 114-1, 114-2. On account of a different construction of the magnetic sensor elements 114-1, 114-2, a direction of rotation of the gearwheel 110 can also be detected, for example on the basis of phase differences between signals of the first and second magnetic sensor elements 114-1, 114-2. Output signals of the magnetic sensor 110 can be fed for example to an electronic control unit (ECU) of a vehicle.

Another different construction for magnetic incremental speed/position sensing is shown in FIG. 1, on the right. In this example, the magnetic sensor 100 is used to detect a position and/or speed of a rotatably movable magnetic encoder wheel (magnetic pole wheel, active pick-up wheel) 120 having alternating magnet poles in the circumferential direction. A back-bias magnet is not required here.

The examples in FIG. 1 can be applied for example in vehicle applications, including angle sensing applications or speed sensing applications, e.g. wheel speed, transmission speed, crankshaft and camshaft sensing.

The magnetic sensor 100 usually calibrates itself, which necessitates waiting until a maximum and a minimum of the external magnetic field have moved past. In this case, it is possible to define a magnetic field threshold at which the sensor supplies an output signal. That is illustrated in principle in FIG. 2.

FIG. 2 shows the basic profile of an external magnetic field generated or influenced by a pick-up wheel. As a result of the rotation of the pick-up wheel, the magnetic field strength has a periodic profile 200 having maxima 202 and minima 204. Between a maximum 202 and a minimum 204 it is possible to define a magnetic field threshold 206 at which the sensor reacts with an output signal pulse. The threshold is usually adapted on the basis of the sensing of maxima and minima of the magnetic field signal and the setting of the threshold on the basis of these measurements. In FIG. 2 the threshold is for example at 50% of the amplitude between minimum 204 and maximum 202. Other fixed or variable threshold values, such as 75%, for example, are likewise possible, of course. This algorithm ensures that the switching point is always kept in a region with a rapid change in the signal and ensures that good jitter behavior is achieved. If the sensor 100 is intended to supply a valid signal before the self-calibration is concluded, it can be calibrated with a start value stored for example in an EEPROM, although this requires a high outlay to achieve the accuracy over all influencing processes, including signal processing, calibration, housing and magnetic switching.

Figure 3:
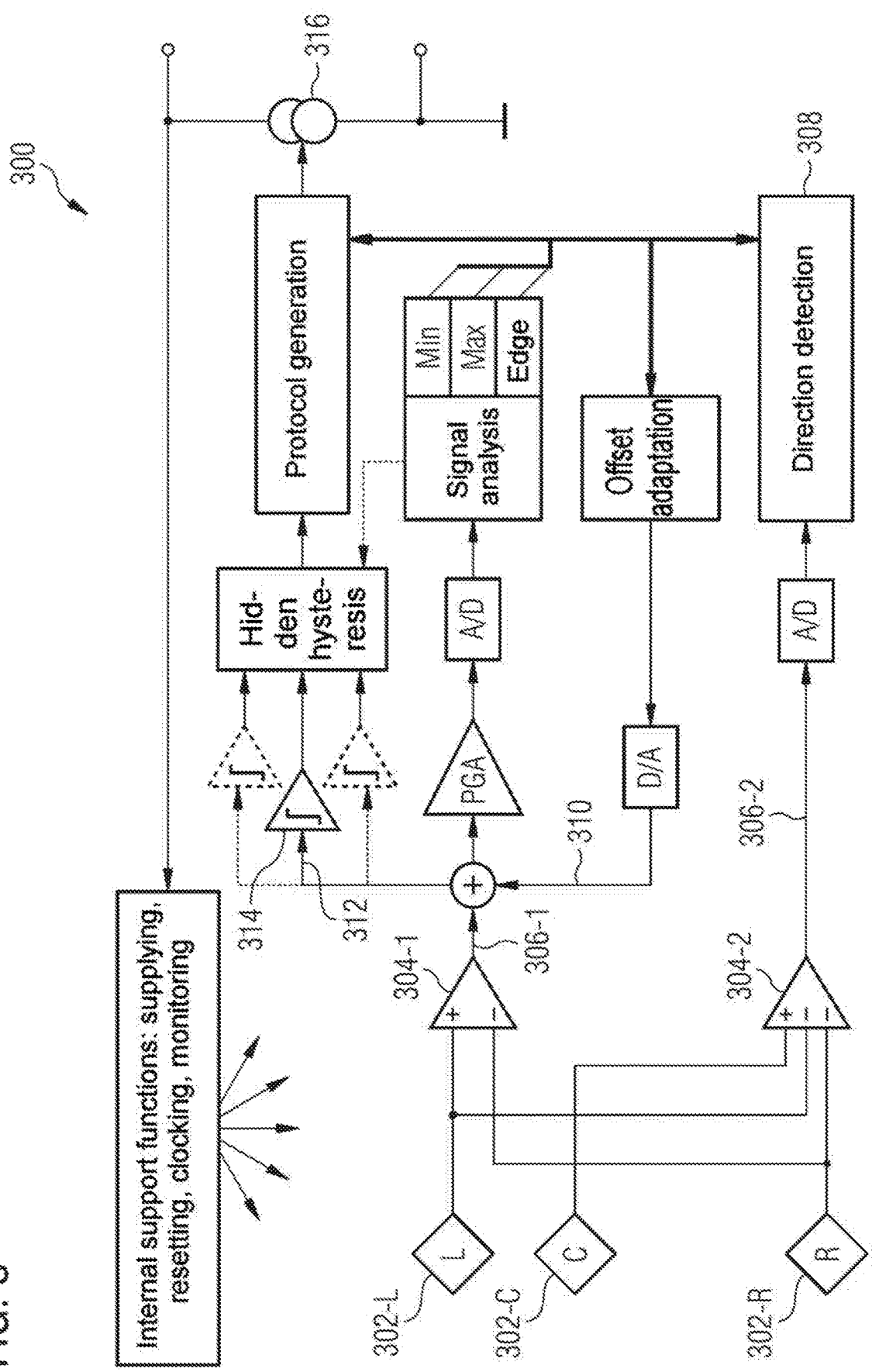
FIG. 3 shows a block diagram of a differential magnetic sensor with three sensor elements and modulated current.

In some incremental speed sensors, additionally a third magnetic field sensor element can be positioned in the center between the two differential sensor elements 114-1, 114-2. This third sensor element makes it possible to detect the direction of rotation. A schematic construction of a differential magnetic field sensor circuit 300 having three magnetic field sensor elements is illustrated in FIG. 3.

The differential magnetic field sensor circuit 300 has a first magnetic field sensor element 302-L, a second magnetic field sensor element 302-R and a third magnetic field sensor element 302-C arranged centrally between the first and second magnetic field sensor elements. The magnetic field sensor elements detect an external magnetic field, for example from an active or passive pick-up wheel. A first differentiator 304-1 determines a first differential signal 306-1 based on measurement signals from the first and second magnetic field sensor elements 302-L and 302-R. A second differentiator 304-2 determines a second differential signal 306-2 based on measurement signals of all three magnetic field sensor elements 302-L, 302-R and 302-C. A direction of rotation can be determined (see reference sign 308) from the second differential signal 306-2. If appropriate, an offset value 310 can be added to the first differential signal 306-1. The resulting summation signal 312 can then be fed to a threshold value comparison 314. An output current 316 is modulated depending on the threshold value comparison 314. Said output current can assume the values 7 mA (low) or 14 mA (high), for example. The modulated output current can be fed for example to a control unit (for example ECU), not illustrated in FIG. 3, for further evaluation.

For the case where an encoder or pick-up wheel rotates rapidly, the behavior of the sensors 302-L, 302-R, 302-C is sufficient, for example for use in ABS and ESP. Recent applications targeted at slow movements of a vehicle, for example hill start assist, are intended however to detect movements of the vehicle which are smaller than the distance between two adjacent threshold value crossings. A resolution in a range of 1°, for example, would be desirable for these applications, while the signal or current pulses of the differential magnetic field sensor circuit 300 each represent a step of 6° for the case where an encoder having 60 poles or teeth is used. Intermediate steps would thus be desirable.

The ASIL level (ASIL: Automotive Safety Integrity Level) extends from A (lowest) to D (highest) and is defined at the system level and made relevant to the component level. ABS is an ASIL D system and the requirements derived for the sensor are ASIL B(D) (i.e. B derived from D, which causes some additional requirements for the development methods). Apart from use for detecting the direction of rotation, the new ABS sensors that attain ASIL B use the central sensor 302-C, which is used for direction detection, as redundant information allowing a decision to be made as to whether the differential signal is permissible. This safety measure is limited to diagnosis errors that occur during the magnetic measurement, and cannot diagnose any kind of erroneous signal processing.

In order to address at least some of the problems discussed, the present disclosure proposes using redundant sensor systems having at least two sensor chips in a common housing and implementing checking mechanisms for example at the ECU level.

In this respect, FIG. 4 shows a first example of a magnetic field sensor arrangement 400 in accordance with the disclosure. The upper schematic side view reveals that the magnetic field sensor arrangement 400 has a sensor housing or package 410. A first sensor chip 420-1 is arranged in the sensor housing 410. The first sensor chip 420-1 comprises an integrated first differential magnetic field sensor circuit having at least a first and second sensor element S1 and S2. The two sensor elements S1 and S2 can be arranged at a distance d corresponding to a tooth or pole distance (pitch) of a pick-up wheel. Optionally, a third sensor element SC can be provided centrally between the sensor elements S1 and S2. In addition, a second, separate sensor chip 420-2 is arranged in the sensor housing 410. The second sensor chip 420-2 comprises an integrated second differential magnetic field sensor circuit having at least a first and second sensor element S1 and S2. Optionally, a third sensor element SC can also be provided centrally between the sensor elements S1 and S2 of the second sensor chip 420-2.

The sensor elements S1, S2, SC can each be Hall sensors or magnetoresistive sensors. In some examples, the two sensor chips 420-1, 420-2 can be structurally identical and based on the same sensor technology. In other examples, however, the two sensor chips 420-1, 420-2 can also be different and based on different sensor technologies, which can increase even further, under certain circumstances, mutual monitoring and thus reliability.

As is illustrated schematically in FIG. 4, the first sensor chip 420-1 and the second sensor chip 420-2 can be arranged on a common leadframe 430 within the sensor housing 410. In this example, the first sensor chip 420-1 is situated on the top side of the leadframe 430. The second sensor chip 420-2, by contrast, is situated in flipped fashion on the underside of the leadframe 430, such that here the two sensor elements S1 and S2 of the second sensor chip 420-2 are arranged in a manner laterally reverse relative to the first sensor chip 420-1. S1 of the upper sensor chip 420-1 is thus situated above S2 of the lower sensor chip 420-2. Correspondingly, S2 of the upper sensor chip 420-1 is situated above S1 of the lower sensor chip 420-2. An offset of the two sensor chips 420-1, 420-2 in a lateral or horizontal direction is not present or is insignificant in this example.

The lower part of FIG. 4 shows schematic plan views of the front or top side (left) and the rear side or underside (right) of the leadframe 430. In this example, the leadframe 430 or the sensor housing 410 has three terminals: a first electrical supply signal terminal 440-1 for the first sensor chip 420-1, a second electrical supply signal terminal 440-2 for the second sensor chip 420-2 and a common ground terminal for both sensor chips 420-1, 420-2. In this example, the two sensor chips thus share the ground terminal 440-3.

Each of the two sensor chips 420-1, 420-2 provides an output signal (current or voltage). For the example illustrated in FIG. 4, the two output signals can be received in each case by way of a modulated signal (current or voltage) between respective supply signal terminal and ground terminal. The output signal of the first sensor chip 420-1 can thus be obtained between terminal 440-1 and ground terminal 440-3, and the output signal of the second sensor chip 420-2 between terminal 440-2 and ground terminal 440-3. This can involve modulated voltages or currents having two or more levels. Separate output signals are thus able to be tapped off. The central sensor SC is in each case optional for the direction detection, as in conventional sensors.

In accordance with some examples, the two sensor chips 420-1, 420-2 can be configured to provide their respective output signal (for example modulated current) in accordance with the same pulse protocol. This can facilitate an evaluation for example in an ECU. That is explained below with reference to FIGS. 5a and 5b.

Figure 5A:
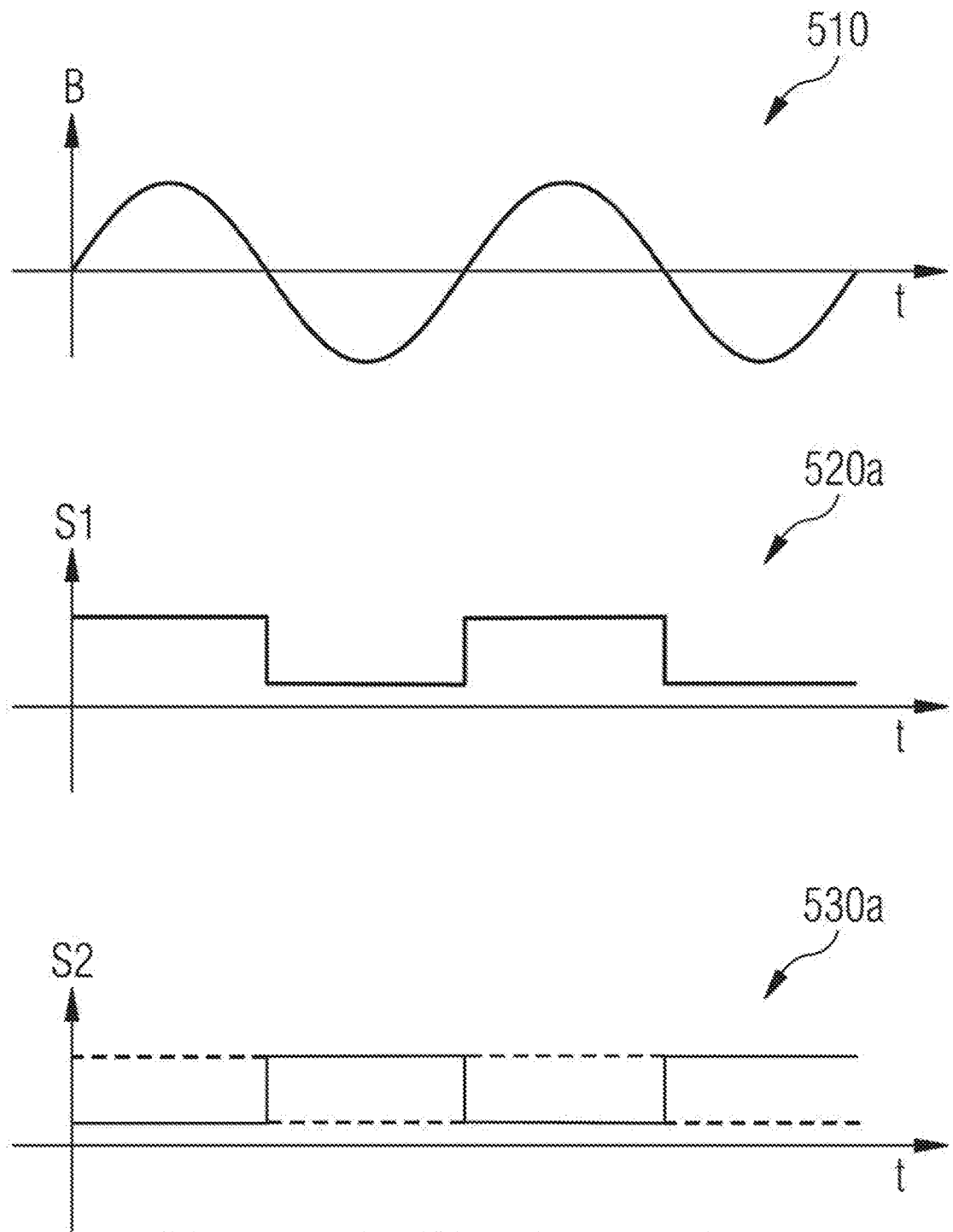
FIGS. 5a and 5b show edge and pulse protocols of output signals of the sensor package from FIG. 4.

The exemplary signal diagram in FIG. 5a shows an edge protocol, wherein for example each zero crossing of a measured external magnetic field switches the output of a sensor chip 420-1, 420-2. In accordance with the example in FIG. 5a, the output of the first sensor chip 420-1 (here the output signal thereof is designated by S1) supplies an output signal 520a with a "high" level (for example 14 mA) for a measured positive B-field 510 and an output signal 520a with a "low" level (for example 7 mA) for a measured negative B-field 510. For the second sensor chip 420-2 (here the output signal thereof is designated by S2) on the underside of the leadframe 430, the behavior can be either exactly the same (if it is programmed for opposite polarity) or exactly opposite (given the same polarity as sensor chip 420-1). As will be explained hereinafter it is possible, if the second sensor chip 420-2 has an inverse differential polarity relative to the first sensor chip 420-1 and the respective output signals thus behave identically, for the two output signals advantageously to be combined to form a common output signal.

Figure 5B:
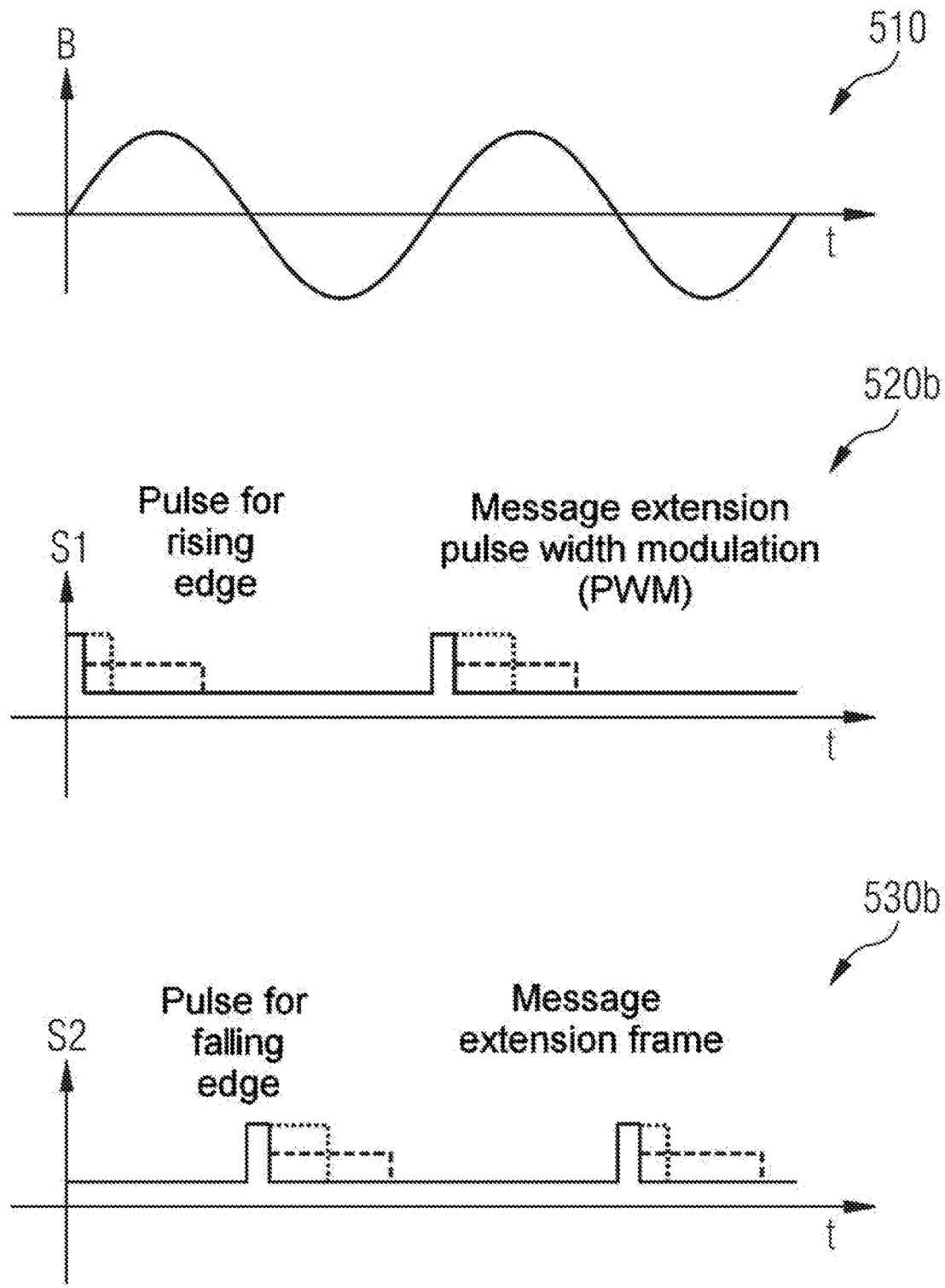

FIG. 5b shows an alternative pulse protocol, wherein each sensor chip 420-1, 420-2 supplies a pulse for a magnetic field zero crossing of a defined edge. In the example in FIG. 5b, sensor chip 420-1 supplies a pulse for a magnetic field zero crossing upon a rising edge, whereas sensor chip 420-2 supplies a pulse for a magnetic field zero crossing upon a falling edge. In other words, the first sensor chip 420-1 or the first differential magnetic field sensor circuit can be configured to generate a first output pulse upon a rising edge of the measured magnetic field. The second sensor chip 420-2 or the second differential magnetic field sensor circuit can be configured to generate a second output pulse upon a falling edge of the measured magnetic field. That is likewise conceivable the other way around, of course. With such a configuration, compared with conventional arrangements, in a predefined time interval double the number of pulses can be communicated, for example to a control unit. The control unit can then identify possible errors of the magnetic field sensor arrangement 400 by evaluation of successive signal pulses belonging to different sensor chips. It should also be mentioned that both sensor chips 420-1, 420-2 can also each supply output pulses upon rising and falling edges of the measured magnetic field, which can even increase the (angular) resolution.

As is indicated in FIG. 5b, in some examples of the pulse protocol it is possible to use the pulse length for a PWM coding (PWM=pulse width modulation) of additional information (such as, for example, direction information or interpolated position), or it is possible to append a digital message (for example some Manchester-modulated bits as in the AK protocol). If the pulses of the first and second sensor chips 420-1, 420-2 are transmitted via a common output or a common line, however, the message should be kept shorter than half of the actual pulse distance for a sensor, in order to avoid a collision with the pulse or protocol for the other sensor.

FIG. 6 shows a further example of a magnetic field sensor arrangement 600 in accordance with the disclosure, which differs from the example in FIG. 4 essentially in the number of housing terminals. While in the example in FIG. 4 three terminals were provided at which separate output signals could be tapped off, in the example in FIG. 6 only two terminals 440-1 (for a supply voltage Vdd) and 440-3 (for ground) are provided. Both sensor chips 420-1, 420-2 are thus supplied jointly here. Furthermore, on account of this configuration there is also only one common output present, as described below with reference to FIGS. 7a and 7b. The example in FIG. 6 with the two-pin housing is suitable for current-modulated communication, in particular. In this case, the supply of both sensor chips 420-1, 420-2 would be connected in parallel, and the output signal would be the sum of both modulated currents.

FIG. 7a once again shows an edge protocol in which each zero crossing of the measured external magnetic field switches the output of a sensor chip 420-1, 420-2. If the second sensor chip 420-2 has an inverse differential polarity relative to the first sensor chip 420-1 and the respective output currents thus behave substantially identically, the two output currents can be added to form a common output current. That can then assume for example the two current levels 14 mA and 28 mA, or with corresponding circuitry also the conventional 7 mA and 14 mA. A connected control unit, by evaluating the summed common output current, can identify possible errors of the magnetic field sensor arrangement 600, for example as a result of implausible signal levels. On account of production tolerances, a different position in the magnetic field and inaccuracy in the chip positioning, the switching event does not necessarily appear exactly synchronous and the sum of the current signal can yield a stepped signal.

FIG. 7b once again shows an alternative pulse protocol, wherein each sensor chip 420-1, 420-2 supplies a current pulse for a magnetic field zero crossing of a defined edge. In the example in FIG. 7b, sensor chip 420-1 supplies a current pulse for a magnetic field zero crossing upon a rising edge, whereas sensor chip 420-2 supplies a current pulse for a magnetic field zero crossing upon a falling edge. With such a configuration, compared with conventional two-pin housings, double the number of current pulses can be communicated. A control unit can then identify possible errors of the magnetic field sensor arrangement 600 by evaluation of successive current pulses belonging to different sensor chips.

FIG. 8 shows a further exemplary embodiment of the present disclosure. The magnetic field sensor arrangement 800 illustrated therein differs from the examples described above firstly in the number of terminals. Here the sensor housing 410 has at least four terminals in order to provide electrically separate supply signal terminals and ground terminals for the first and the second sensor chips 420-1, 420-2. Here the terminals 440-1 (Vdd1) and 440-3 (Ground1) are assigned to the sensor chip 420-1, and the terminals 440-2 (Vdd2) and 440-4 (Ground2) are assigned to the sensor chip 420-2. Accordingly, separate outputs can also be provided in this embodiment. A further difference is that an insulation layer 805 is arranged between leadframe 430 and lower sensor chip 420-2 in order to avoid any electrical contact between the two sensor chips 420-1, 420-2. This can support the independence of both sensors with regard to an electrical coupling effect.

Figure 9:
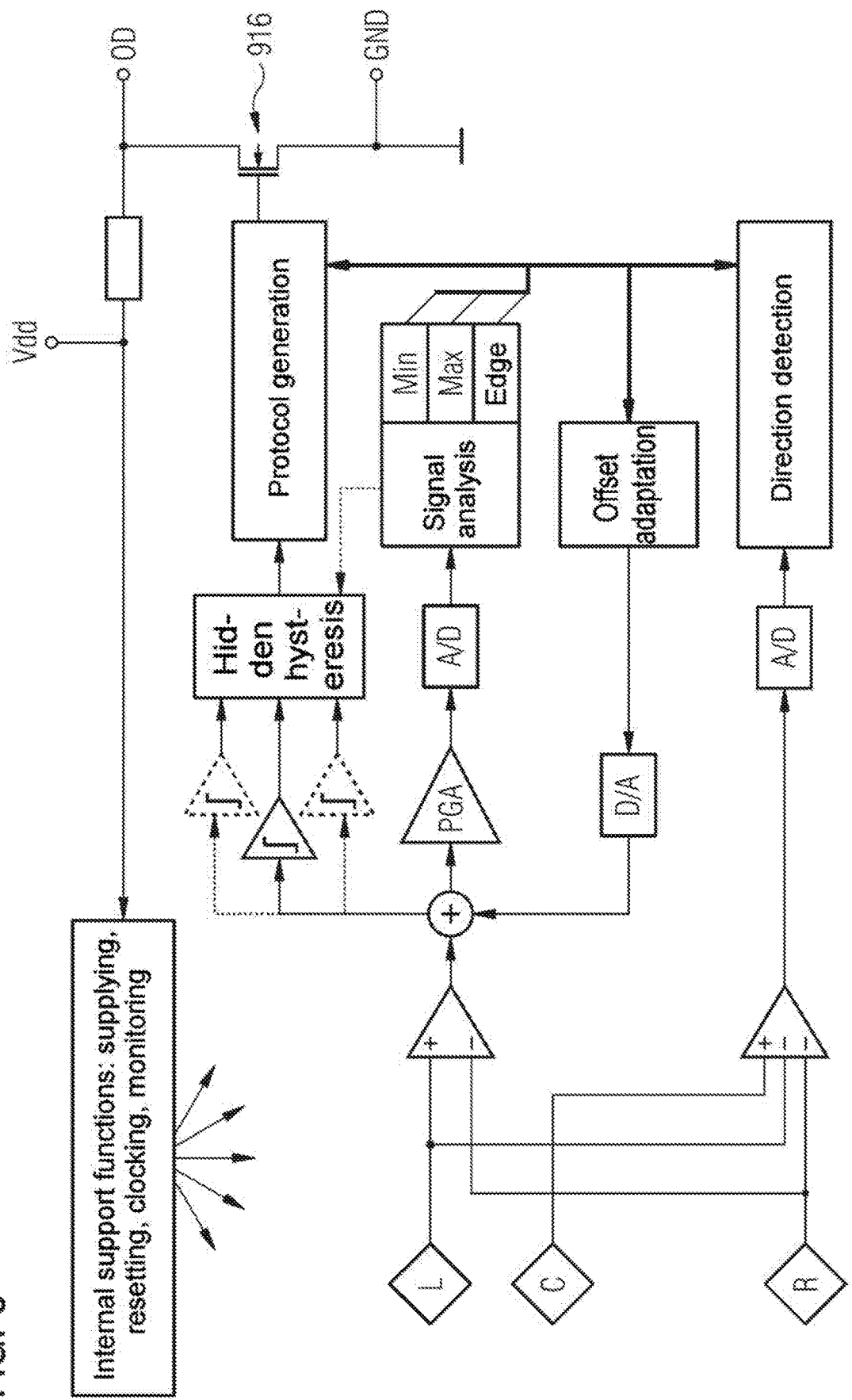
FIG. 9 shows a block diagram of a differential magnetic sensor with three sensor elements and modulated voltage.

The redundancy concept presented herein can also be used for sensors using an open-collector or open-drain pull-down switch instead of current modulation. The block diagram of a sensor of this type is shown in FIG. 9. It differs from FIG. 3 principally in the use of the switch 916 instead of the modulated current source 316. In this case, the sensor housing 410 used can have an additional open-drain (OD) terminal 440-2. In the exemplary case of a housing having three terminal pins, as is illustrated schematically FIG. 10, the two sensor chips 420-1, 420-2 can be supplied in parallel via the terminals 440-1 (Vdd), 440-3 (GND) and the open-drain switches 916 can operate on the same line 440-2.

An exemplary signal protocol for the exemplary embodiment in FIG. 10 is shown in FIG. 11, wherein for example each zero crossing of a measured external magnetic field switches the OD output of a sensor chip 420-1, 420-2. In the case of two parallel open-drain switches that operate on the same line with pull-up, the combined signal leads to a wired OR function of the pull-down.

Each of the magnetic field sensor arrangements shown above can for example also be implemented with half a pitch offset between the two sensor chips 420-1, 420-2. In other words, the first sensor chip 420-1 and the second sensor chip 420-2 can also be arranged with a lateral offset with respect to one another within the sensor housing 410.

An embodiment similar to FIG. 4, but with a lateral offset between the two sensor chips, is illustrated in FIG. 12. The difference with respect to FIG. 4 consists essentially in the lateral offset of the two sensor chips 420-1 and 420-2, which can be for example half a pitch (tooth distance) d/2, such that the sensor element S2 of the lower sensor chip 420-2 is arranged below the (optional) central third sensor element SC of the upper sensor chip 420-1 and the (optional) central third sensor element SC of the lower sensor chip 420-2 is arranged below the second sensor element S2 of the upper sensor chip 420-1.

The laterally displaced implementation of the two sensor chips 420-1, 420-2 can afford the following advantages. Firstly, the (angular) resolution can be increased by a factor of 2. Furthermore, the direction detection can be implemented externally, depending on a positive or negative phase shift of the two output signals of the sensor chips 420-1, 420-2. This allows the removal of the optional central position sensor and the direction circuit arrangement 308 from both sensors 420-1, 420-2, which can in turn lead to area and cost saving. Alternatively, an external direction detection can be implemented as an additional safety measure, as a result of which it is possible to increase the diagnosis coverage for functional reliability.

Figure 13A:
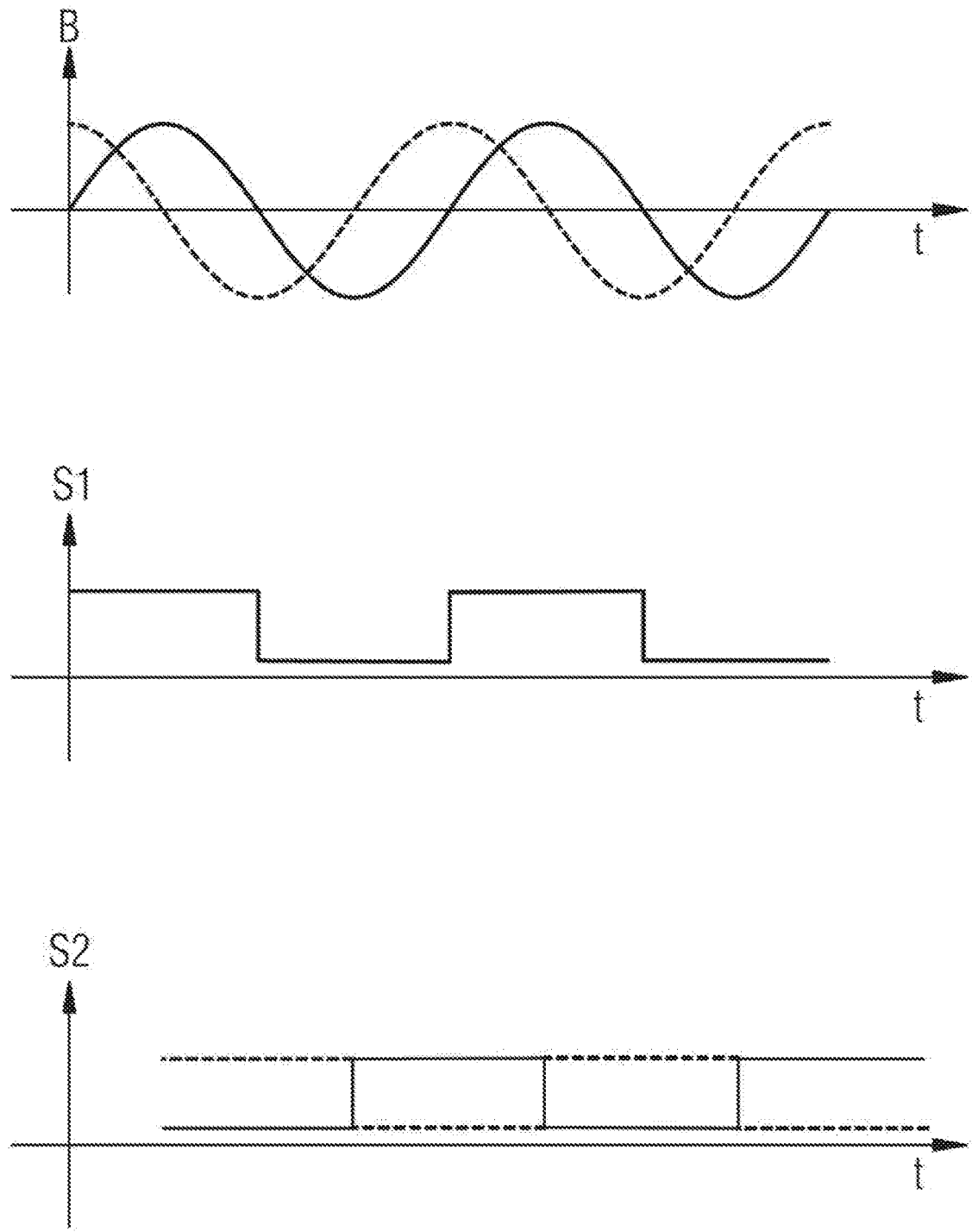

The exemplary signal diagram in FIG. 13a shows an edge protocol, wherein once again each zero crossing of the external magnetic field respectively measured by each sensor chip 420-1, 420-2 switches the output of the sensor chip 420-1, 420-2. On account of the lateral offset, the sensor chips 420-1, 420-2 each "see" slightly different magnetic fields. In accordance with the example in FIG. 13a, the output of the first sensor chip 420-1 (here the output signal is designated by S1) supplies an output signal with a "high" level (for example 14 mA) for a measured positive B-field 510 and an output signal with a "low" level (for example 7 mA) for a measured negative B-field. For the laterally displaced second sensor chip 420-2 on the underside of the leadframe 430, the behavior can be either exactly the same (if it is programmed for opposite polarity) or exactly the opposite (given the same polarity as sensor chip 420-1).

FIG. 13b shows an alternative pulse protocol, wherein each sensor chip 420-1, 420-2 supplies a pulse for a magnetic field zero crossing of a defined edge. In the example in FIG. 13b, sensor chip 420-1 supplies a pulse for a magnetic field zero crossing upon a rising edge. Likewise, in this example, the laterally offset sensor chip 420-2 supplies a pulse for a magnetic field zero crossing upon a rising edge. With such a configuration, compared with conventional arrangements, the angular resolution can be increased. Moreover, a control unit can identify possible errors of the magnetic field sensor arrangement 1200 by evaluation of successive signal pulses belonging to different sensor chips. It will be immediately apparent to the person skilled in the art that the sensor chips 420-1, 420-2 could also be configured to supply signal pulses upon both rising and falling edges of the respectively measured magnetic field.

Figure 14:
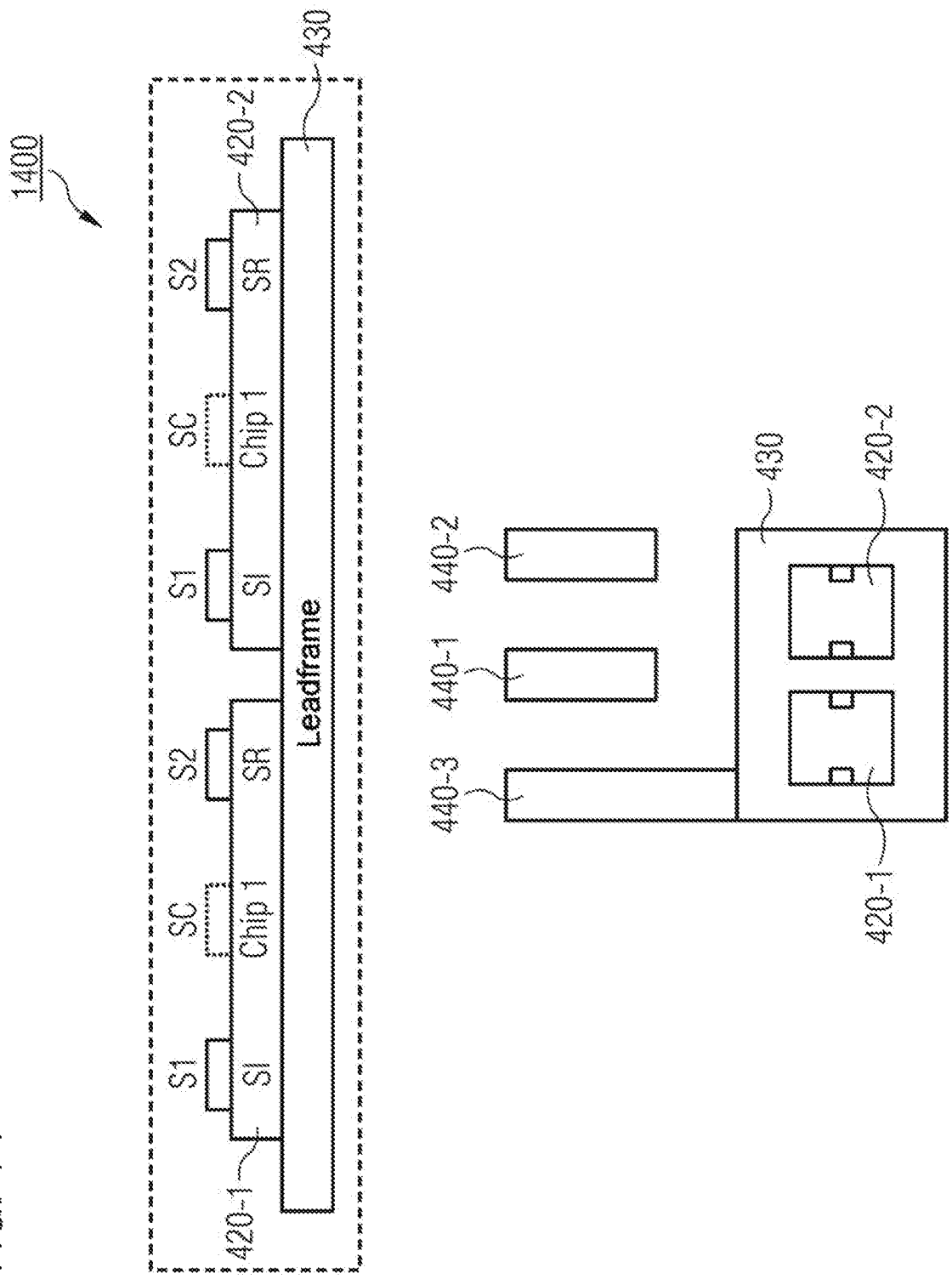
FIG. 14 shows a sixth exemplary embodiment of a sensor package with two laterally offset differential magnetic sensor chips.

Although hereinabove the focus was on exemplary embodiments in which the first sensor chip 420-1 is arranged on a top side of the common leadframe 430 and the second sensor chip 420-2 is arranged on an underside of the common leadframe 430, exemplary embodiments are also provided in which both chips are secured on the same side of the leadframe 430. One such variant, with terminals similar to those in FIG. 4, is shown schematically in FIG. 14. In the case of the magnetic field sensor arrangement 1400, the first sensor chip 420-1 and the second sensor chip 420-2 are arranged alongside one another on the same side of the common leadframe 430. This arrangement admittedly requires an increased housing size, which in a horizontal direction would be approximately doubled in comparison with the quasi standard size of the housings that is customary in conventional applications. One advantage, however, is that the redundancy is extended to the magnetic switching, in the sense that the two sensor chips 420-1, 420-2 monitor different pole pairs of a pick-up wheel, and it would be completely within the scope of the specification for a ferromagnetic particle to adhere to the pole wheel and to short-circuit the magnetic field of the affected pole pair.

Figure 15:
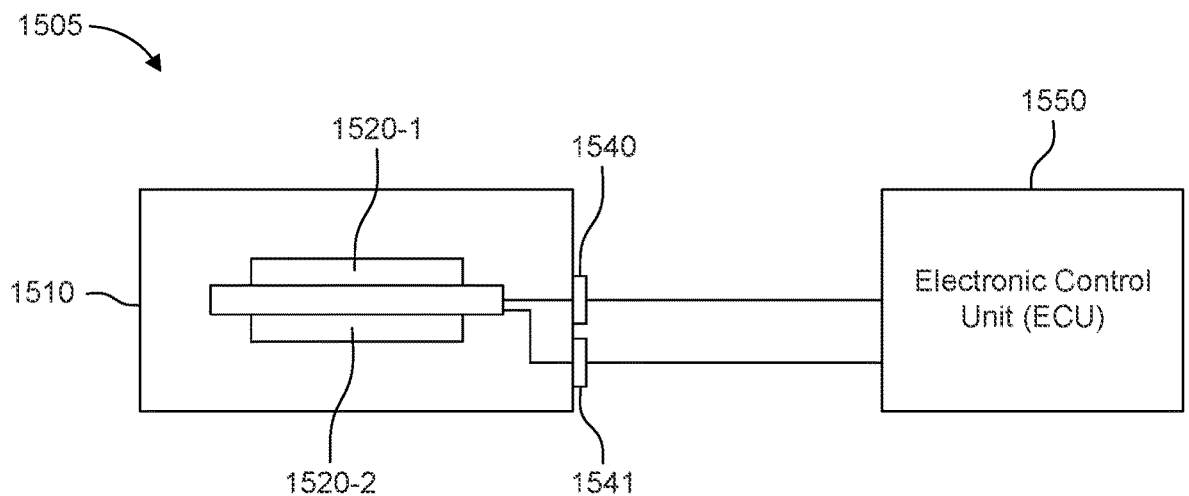
FIG. 15 shows a system comprising sensor package with two differential magnetic sensor chips and control unit.

The various exemplary embodiments described above relate to redundant sensor systems in a housing. Checking mechanisms can be implemented for example at the ECU level. To that end, FIG. 15 shows a system 1500 having a magnetic field sensor arrangement 1505 having two sensor chips in accordance with the present disclosure. The magnetic field sensor arrangement 1505 comprises a first sensor chip 1520-1 having an integrated first differential magnetic field sensor circuit, said first sensor chip being arranged in a common sensor housing 1510, and a second sensor chip 1520-2 having an integrated second differential magnetic field sensor circuit, said second sensor chip being arranged in the common sensor housing 1510. The magnetic field sensor arrangement 1505 or the housing 1510 comprises at least one output signal terminal, including output terminals 1540 and 1541 for output signals of the first and second sensor chips depending on an external magnetic field. For example, in the case of FIG. 4 in which two separate output signals are output, output terminal 1540 may output an output signal from sensor chip 420-1 and output terminal 1541 may output an output signal from sensor chip 420-2. As a result, two output terminals are used to transmit output signals to a control unit 1550. Alternative, in the case of FIG. 6, only one of the output terminals 1540 and 1541 may be used or both may be present. Here, each sensor chip 420-1 and 420-2 may modulate a respective current and the modulated currents can be combined, for example, by summing, to generate a combined output signal that is output by one of the output terminals 1540 or 1541. Accordingly, the number of output terminals present or used may vary based on the embodiments described above. Furthermore, the system 1500 comprises a control unit 1550 coupled to the output signal terminals 1540 and 1541 of the magnetic field sensor arrangement 1505.

As was described above, the at least one output signal terminal 1540 can comprise one terminal or else a plurality of separate terminals in order to transmit signal pulses of the sensor chips 1520-1, 1520-2 via one or more separate lines to the control unit 1550.

Figure 16:
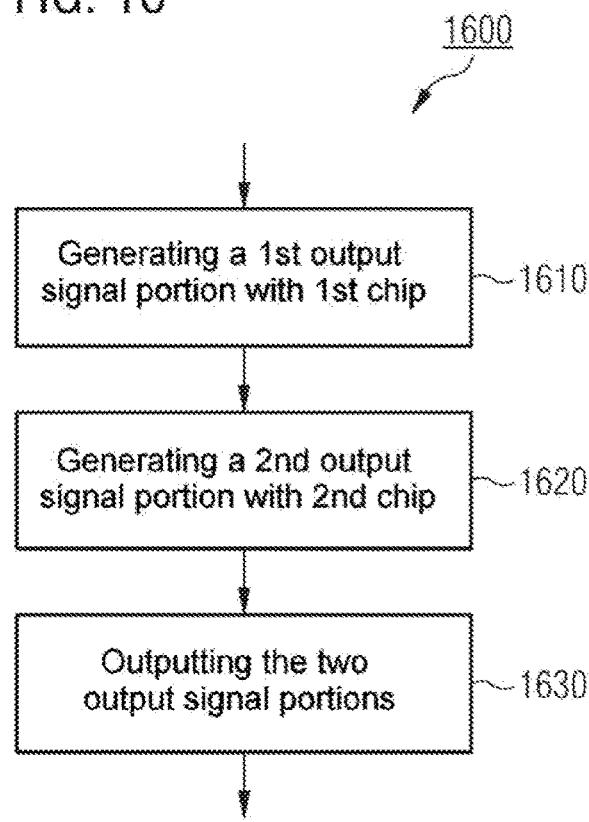
FIG. 16 shows a flow diagram of a method for measuring an external magnetic field.

FIG. 16 shows a schematic flow diagram of a method 1600 for measuring an external magnetic field. The method comprises generating 1610, in response to the external magnetic field, a first output signal portion by means of a first sensor chip having an integrated first differential magnetic field sensor circuit, said first sensor chip being arranged in a common sensor housing, and generating 1620, in response to the external magnetic field, a second output signal portion by means of a second sensor chip having an integrated second differential magnetic field sensor circuit, said second sensor chip being arranged in a common sensor housing. The first and second output signal portions are output 1630 via at least one output signal terminal of the sensor housing.

The aspects and features that have been described together with one or more of the examples and figures detailed above can also be combined with one or more of the other examples in order to replace an identical feature of the other example or in order additionally to introduce the feature into the other example.

If appropriate, some exemplary embodiments furthermore can be or relate to a computer program comprising a program code for performing one or more of the above methods when the computer program is executed on a computer or processor. Steps, operations or processes of different methods described above can be carried out by programmed computers or processors. Examples can also cover program storage devices, e.g. digital data storage media, which are machine-, processor- or computer-readable and code machine-executable, processor-executable or computer-executable programs of instructions. The instructions carry out some or all of the steps of the methods described above or cause them to be carried out. The program storage devices can comprise or be e.g. digital memories, magnetic storage media such as, for example, magnetic disks and magnetic tapes, hard disk drives or optically readable digital data storage media. Further examples can also cover computers, processors or control units which are programmed to carry out the steps of the methods described above, or (field) programmable logic arrays ((F)PLAs) or (field) programmable gate arrays ((F)PGAs) which are programmed to carry out the steps of the methods described above.

The description and drawings present only the principles of the disclosure. Furthermore, all examples mentioned here are intended to be used expressly only for teaching purposes, in principle, in order to assist the reader in understanding the principles of the disclosure and the concepts contributed by the inventor(s) for further development of the art. All statements herein regarding principles, aspects and examples of the disclosure and also concrete examples thereof are intended to encompass the counterparts thereof.

A function block designated as "Means for . . . " carrying out a specific function can relate to a circuit configured for carrying out a specific function. Consequently a "Means for something" can be implemented as a "Means configured for or suitable for something", e.g. a component or a circuit configured for or suitable for the respective task.

Functions of different elements shown in the figures including those function blocks designated as "Means", "Means for providing a signal", "Means for generating a signal", etc. can be implemented in the form of dedicated hardware, e.g. "a signal provider", "a signal processing unit", "a processor", "a controller" etc., and as hardware capable of executing software in conjunction with associated software. When provided by a processor, the functions can be provided by a single dedicated processor, by a single jointly used processor or by a plurality of individual processors, some or all of which can be used jointly. However, the term "processor" or "controller" is far from being limited to hardware capable exclusively of executing software, but rather can encompass digital signal processor hardware (DSP hardware), network processor, application specific integrated circuit (ASIC), field programmable logic array (FPGA=Field Programmable Gate Array), read only memory (ROM) for storing software, random access memory (RAM) and nonvolatile memory device (storage). Other hardware, conventional and/or customized, can also be included.

A block diagram can illustrate for example a rough circuit diagram which implements the principles of the disclosure. In a similar manner, a flow diagram, a flow chart, a state transition diagram, a pseudo-code and the like can represent various processes, operations or steps which are represented for example substantially in a computer-readable medium and are thus performed by a computer or processor, regardless of whether such a computer or processor is explicitly shown. Methods disclosed in the description or in the patent claims can be implemented by a component having a means for performing each of the respective steps of said methods.

It goes without saying that the disclosure of a plurality of steps, processes, operations or functions disclosed in the description or the claims should not be interpreted as being in the specific order, unless this is explicitly or implicitly indicated otherwise, e.g. for technical reasons. The disclosure of a plurality of steps or functions therefore does not limit them to a specific order, unless said steps or functions are not interchangeable for technical reasons. Furthermore, in some examples, an individual step, function, process or operation can include a plurality of partial steps, functions, processes or operations and/or be subdivided into them. Such partial steps can be included and be part of the disclosure of said individual step, provided that they are not explicitly excluded.

Furthermore, the claims that follow are hereby incorporated in the detailed description, where each claim can be representative of a separate example by itself. While each claim can be representative of a separate example by itself, it should be taken into consideration that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

What is claimed is:

1. A system, comprising:
 a magnetic field sensor package including:
  a common sensor housing;
  a first sensor chip having a first integrated differential magnetic field sensor circuit configured to generate a first output signal comprising first signal pulses, each of the first signal pulses being generated in response to a rising edge of an external magnetic field, the first sensor chip being arranged in the common sensor housing;
  a second sensor chip having a second integrated differential magnetic field sensor circuit configured to generate a second output signal comprising second signal pulses, each of the second signal pulses being generated in response to a falling edge of the external magnetic field, the second sensor chip being arranged in the common sensor housing;
  a leadframe, wherein the first sensor chip and the second sensor chip are coupled to different areas of the leadframe, wherein the leadframe is configured to receive the first output signal and the second output signal from the first senor chip and the second sensor chip, respectively; and at least one output signal terminal coupled to the leadframe, the at least one output signal terminal configured to output the first and the second output signals from the magnetic field sensor package; and a controller coupled to the at least one output signal terminal of the magnetic field sensor package for receiving the first and the second signal pulses from the at least one output signal terminal, wherein the controller is external to the magnetic field sensor package, wherein the controller is configured to evaluate a pulse output pattern comprising both the first signal pulses and the second signal pulses and detect an error in operation of at least one of the first sensor chip or the second sensor chip in response to the pulse output pattern of the first and the second signal pulses not satisfying an expected pulse output pattern of the first and the second signal pulses.

2. The system as claimed in claim 1, wherein:

the magnetic field sensor package comprises a first output signal terminal of the at least one output signal terminal configured to output the first output signal and a second output signal terminal of the at least one output signal terminal configured to output the second output signal, when the error is not present, the first signal pulses of the first output signal are temporally interleaved with the second signal pulses of the second output signal on an alternating one-by-one basis in accordance with the expected pulse output pattern, when the error is present, the first signal pulses of the first output signal are not temporally interleaved with the second signal pulses of the second output signal on an alternating one-by-one basis, the controller is configured to evaluate the output pattern of the first and the second signal pulses and determine whether the error is not present or is present in response to detecting the expected output pattern or not, respectively.

3. The system as claimed in claim 1, wherein:

the magnetic field sensor package comprises a common output circuit configured to generate a common output signal as a sum of the first output signal and the second output signal, the at least one output signal terminal comprises a common output terminal configured to output the common output signal, wherein the error is not present, the common output signal switches between different expected signal levels in accordance with the expected pulse output pattern of the first and the second signal pulses, when the error is present, the common output signal switches to at least one implausible signal level, the controller is configured to evaluate signal levels of the common output signal corresponding to the pulse output pattern of the first and the second signal pulses and determine whether the error is not present or is present in response to detecting the different expected signal levels or the at least one implausible signal level, respectively.

4. The system as claimed in claim 1, wherein:

the magnetic field sensor package comprises a common output circuit configured to generate a common output signal as a sum of the first output signal and the second output signal, the at least one output signal terminal comprises a common output terminal configured to output the common output signal, when the error is not present, the common output signal remains constant in accordance with the expected pulse output pattern of the first and the second signal pulses, when the error is present, the common output signal switches between at least two signal levels, the controller is configured to evaluate signal levels of the common output signal corresponding to the pulse output pattern of the first and the second signal pulses and determine whether the error is not present or is present in response to detecting whether the common output signal is constant or not, respectively.

5. The system as claimed in claim 1, wherein:

the first sensor chip is configured to pulse width modulate the first signal pulses in order to encode information on the first signal pulses, and the second sensor chip is configured to pulse width modulate the second signal pulses in order to encode information on the second signal pulses.

6. The system as claimed in claim 5, wherein the encoded information indicates a rotational direction of a target object that modulates the external magnetic field.

7. The system as claimed in claim 1, wherein controller is configured to evaluate the pulse output pattern by evaluating a sequence order of the first signal pulses and the second signal pulses and comparing the sequence order to an expected sequence order of the first and the second signal pulses to determine whether the pulse output pattern satisfies the expected pulse output pattern.

8. A method for measuring an external magnetic field, the method comprising:

generating a first output signal comprising first signal pulses, each of the first signal pulses being generated in response to a rising edge of an external magnetic field, wherein the first output signal is generated by a first sensor chip having a first integrated differential magnetic field sensor circuit, the first sensor chip being arranged in a common sensor housing;

generating a second output signal comprising second signal pulses, each of the second signal pulses being generated in response to a falling edge of the external magnetic field, wherein the second output signal is generated by a second sensor chip having a second integrated differential magnetic field sensor circuit, the second sensor chip being arranged in the common sensor housing;

transmitting the first output signal and the second output signal through a leadframe arranged in the common sensor housing, wherein the first sensor chip and the second sensor chip are coupled to different areas of the leadframe;

outputting the first output signal and the second output signal via at least one output signal terminal of the common sensor housing;

evaluating, by a controller arranged external to the common sensor housing, the first and the second signal pulses of the first output signal and the second output signal for an expected pulse output pattern of the first and the second signal pulses; and detecting, by the controller, an error of an operation of at least one of the first sensor chip and the second sensor chip in response to a pulse output pattern of the first and the second signal pulses not satisfying the expected pulse output pattern of the first and the second signal pulses.

9. The method of claim 8, wherein:
evaluating, by the controller, the first and the second signal pulses of the first output signal and the second output signal for an expected pulse output pattern of the first and the second signal pulses, wherein the expected pulse output pattern is an expected sequence order of the first and the second signal pulses, and
detecting, by the controller, the error of the operation of at least one of the first sensor chip and the second sensor chip comprises detecting a deviation of a sequence order of the first signal pulses and the second signal pulses from the expected sequence order of the first and the second signal pulses.

\* \* \* \* \*